US012804911B2

(12) United States Patent
Noh et al.

(10) Patent No.: US 12,804,911 B2
(45) Date of Patent: Nov. 17, 2026

(54) VERTICAL MEMORY DEVICE

(71) Applicant: SAMSUNG ELECTRONICS CO., LTD., Suwon-si (KR)

(72) Inventors: Youngji Noh, Suwon-si (KR); Jongho Woo, Suwon-si (KR); Jooheon Kang, Suwon-si (KR); Kyunghoon Kim, Suwon-si (KR); Myunghun Woo, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 456 days.

(21) Appl. No.: 18/497,027

(22) Filed: Oct. 30, 2023

(65) Prior Publication Data

US 2024/0172457 A1 May 23, 2024

(30) Foreign Application Priority Data

Nov. 18, 2022 (KR) ........................ 10-2022-0155162

(51) Int. Cl.
*H10B 63/00* (2023.01)

(52) U.S. Cl.
CPC ........... *H10B 63/845* (2023.02); *H10B 63/34* (2023.02)

(58) Field of Classification Search
CPC .................................................... H10B 63/845
See application file for complete search history.

(56) References Cited

U.S. PATENT DOCUMENTS 8,828,884 B2 * 9/2014 Lee ........................ H10B 10/00 438/242
9,865,540 B2 1/2018 Kim et al.
10,026,746 B2 7/2018 Lee et al.
10,535,679 B2 1/2020 Baek et al.
10,727,115 B2 * 7/2020 Nam ...................... H10B 41/27
10,804,363 B2 10/2020 Hwang et al.
(Continued)

FOREIGN PATENT DOCUMENTS

CN 112204742 A 1/2021
KR 10-2012-0030193 3/2012
(Continued)

OTHER PUBLICATIONS

Office Action dated Apr. 30, 2026 issued in corresponding to Korean Patent Application No. 10-2022-0155162.

*Primary Examiner* — William A Harriston

(74) *Attorney, Agent, or Firm* — Morgan, Lewis & Bockius LLP

(57) ABSTRACT

A vertical memory device may include a cell stacked structure on a substrate, wherein the cell stacked structure includes an insulation layer pattern and a gate pattern are alternately and repeatedly stacked, and wherein the cell stacked structure extends in a first direction parallel to an upper surface of the substrate, and wherein an edge portion in the first direction of the cell stacked region is disposed in the second region and has a step portion having a step shape; an etch stop structure on an upper surface of each of gate patterns of the step portion of the cell stacked structure, wherein the etch stop structure includes a transition metal oxide; an insulating interlayer covering the cell stacked structure; and a contact plug passing through the insulating interlayer and the etch stop structure, wherein the contact plug contacts the upper surface of each of the gate patterns.

20 Claims, 34 Drawing Sheets

(56) References Cited

U.S. PATENT DOCUMENTS

| | | | | |
|---|---|---|---|---|
| 11,024,640 | B2 * | 6/2021 | Hwang | H10B 41/10 |
| 11,101,276 | B2 | 8/2021 | Zhu et al. | |
| 11,145,672 | B2 | 10/2021 | Baek et al. | |
| 11,728,303 | B2 | 8/2023 | Chen et al. | |
| 11,894,269 | B2 * | 2/2024 | Hopkins | H10B 41/27 |
| 2010/0090286 | A1 * | 4/2010 | Lee | H10B 41/20 257/E27.081 |
| 2012/0070944 | A1 | 3/2012 | Kim et al. | |
| 2012/0077320 | A1 * | 3/2012 | Shim | H10B 43/27 438/269 |
| 2016/0190322 | A1 * | 6/2016 | Liu | H10D 30/0212 438/283 |
| 2016/0307910 | A1 * | 10/2016 | Son | H10B 41/35 |
| 2017/0084532 | A1 * | 3/2017 | Son | H10B 43/10 |
| 2017/0110365 | A1 * | 4/2017 | Oh | H10B 41/50 |
| 2017/0117222 | A1 * | 4/2017 | Kim | H10B 43/27 |
| 2017/0194347 | A1 * | 7/2017 | Lee | H10B 20/40 |
| 2020/0152654 | A1 * | 5/2020 | Hwang | H10B 41/10 |

FOREIGN PATENT DOCUMENTS

| | | |
|---|---|---|
| KR | 10-2017-0046892 | 5/2017 |
| KR | 10-2019-0113291 | 10/2019 |
| KR | 10-2020-0051100 | 5/2020 |
| KR | 10-2020-0055186 | 5/2020 |

* cited by examiner

VERTICAL MEMORY DEVICE

CROSS-REFERENCE TO RELATED APPLICATION

This application claims priority under 35 USC § 119 to Korean Patent Application No. 10-2022-0155162, filed on Nov. 18, 2022, in the Korean Intellectual Property Office (KIPO), the contents of which is incorporated by reference herein in its entirety.

BACKGROUND

1. Field

Example embodiments of the present disclosure relate to a vertical memory device. More particularly, example embodiments of the present disclosure relate to a NAND flash memory device.

2. Description of the Related Art

Recently, a vertical memory device having a structure in which memory cells are vertically stacked has been developed. The vertical memory device may include wirings electrically connected to memory cells formed at each of vertical levels.

SUMMARY

Example embodiments can provide a vertical memory device having excellent electrical connection characteristics and a simple wiring structure.

According to example embodiments, there may be provided vertical memory device. The vertical memory device may include a lower semiconductor layer on a substrate including a first region and a second region; a cell stacked structure on the lower semiconductor layer, the cell stacked structure including an insulation layer pattern and a gate pattern that are alternately and repeatedly stacked, wherein the cell stacked structure extends in a first direction parallel to an upper surface of the substrate, and wherein an edge portion in the first direction of the cell stacked structure is disposed in the second region and has a step portion having a step shape; an etch stop structure on an upper surface of each of gate patterns of the step portion of the cell stacked structure, wherein the etch stop structure includes a first variable resistance pattern and a mask pattern that are stacked; a channel structure passing through the cell stacked structure on the first region, and extending to an inner portion of the lower semiconductor layer; an insulating interlayer covering the cell stacked structure; and a contact plug passing through the insulating interlayer and the etch stop structure in the second region, wherein the contact plug contacts the upper surface of each of the gate patterns in the second region.

According to example embodiments, there may be provided a vertical memory device. The vertical memory device may include a lower semiconductor layer on a substrate including a first region and a second region; a cell stacked structure on the lower semiconductor layer, wherein the cell stacked structure includes an insulation layer pattern and a gate pattern that are alternately and repeatedly stacked, and wherein the cell stacked structure extends in a first direction parallel to an upper surface of the substrate, and wherein an edge portion in the first direction of the cell stacked structure is disposed in the second region and has a step portion having a step shape; an etch stop structure on an upper surface of each of gate patterns of the step portion of the cell stacked structure, wherein the etch stop structure includes a first variable resistance pattern and a mask pattern that are stacked; a channel structure in a channel hole passing through the cell stacked structure on the first region and extending to an inner portion of the lower semiconductor layer, wherein the channel structure includes a gate insulation layer pattern, a channel, and a cell variable resistance pattern that are stacked on a sidewall of the channel hole, and wherein the channel is electrically connected to the lower semiconductor layer; an insulating interlayer covering the cell stacked structure; and a contact plug passing through the insulating interlayer and the etch stop structure in the second region, and the contact plug contacting the upper surface of each of the gate patterns in the second region. The cell variable resistance pattern and the first variable resistance pattern may include the same material. A thickness in a horizontal direction of the cell variable resistance pattern formed on the sidewall of the channel hole may be the same as a thickness in a vertical direction of the first variable resistance pattern on the upper surface of the gate patterns.

According to example embodiments, there may be provided a vertical memory device. The vertical memory device may include a cell stacked structure on a substrate, wherein the cell stacked structure includes an insulation layer pattern and a gate pattern that are alternately and repeatedly stacked, and wherein the cell stacked structure extends in a first direction parallel to an upper surface of the substrate, and wherein an edge portion in the first direction of the cell stacked region is disposed in the second region and has a step portion having a step shape; an etch stop structure on an upper surface of each of gate patterns of the step portion of the cell stacked structure, wherein the etch stop structure includes a transition metal oxide; an insulating interlayer covering the cell stacked structure; and a contact plug passing through the insulating interlayer and the etch stop structure, wherein the contact plug contacts the upper surface of each of the gate patterns.

According to example embodiments, the etch stop structure in which the first variable resistance pattern and the mask pattern are stacked may be formed on the upper surface of the gate pattern of the step portion in the cell stacked structure. The contact plugs may contact the gate patterns, respectively, by passing through the etch stop structures. As the etch stop structures are included in the cell stacked structure, defects of the contact plugs may be decreased.

BRIEF DESCRIPTION OF THE DRAWINGS

Example embodiments will be more clearly understood from the following detailed description taken in conjunction with the accompanying drawings.

FIGS. 1 to 25 are cross-sectional views and plan views illustrating a method of manufacturing a vertical memory device according to example embodiments.

FIG. 26 is an enlarged view of a contact plug of a vertical memory device according to example embodiments.

FIG. 27 is an enlarged view of a contact plug of a vertical memory device according to example embodiments.

FIG. 28 is an enlarged view of a contact plug of a vertical memory device according to example embodiments.

FIGS. 29 to 35 are cross-sectional views illustrating a method of manufacturing a vertical memory device according to example embodiments.

DESCRIPTION OF EMBODIMENTS

Hereinafter in the specifications, two directions crossing each other among horizontal directions, which are substantially parallel to an upper surface of a substrate, may be referred to as first and second directions, respectively. A direction substantially perpendicular to the upper surface of the substrate is defined as a vertical direction.

FIGS. 1 to 25 are cross-sectional views and plan views illustrating a method of manufacturing a vertical memory device according to example embodiments.

FIGS. 1 to 3, 5 to 7, 9 to 18, and 20 to 24 are cross-sectional views of the vertical memory devices taken in the first direction. FIGS. 4, 8, 19 and 25 are plan views of the vertical memory devices.

Figure 1:
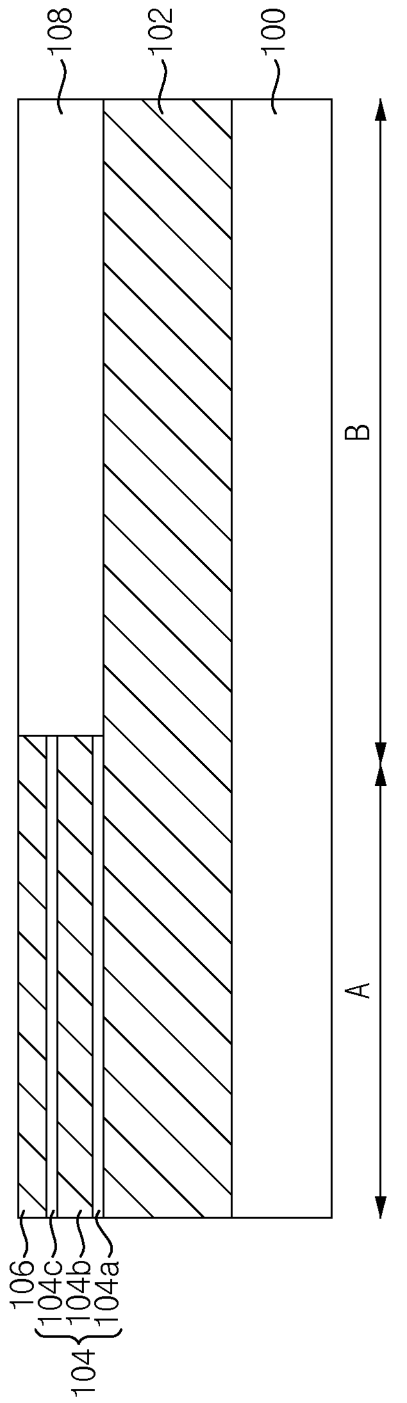
FIGS. 1 to 35 represent non-limiting, example embodiments as described herein.

Referring to FIG. 1, a lower semiconductor layer 102 may be formed on a substrate 100.

The substrate 100 may include a first region A where a memory cell array is formed and a second region B extending from the memory cell array. The second region B may be a region for forming cell contacts electrically connected to gate patterns included in memory cells. The first region, A, and the second region, B, may include an upper surface of the substrate 100 and a region extending in the vertical direction from the upper surface of the substrate 100.

In various embodiments, the lower semiconductor layer 102 may include, e.g., polysilicon or single crystal silicon. The lower semiconductor layer 102 may serve as a common source plate. In example embodiments, the lower semiconductor layer 102 may be formed on the substrate 100 of the first and second regions A and B.

In various embodiments, a lower sacrificial layer structure 104 and a support layer pattern 106 may be formed on the lower semiconductor layer 102 of the first region A. A lower insulation layer pattern 108 may be formed on the lower semiconductor layer 102 of the second region B. An upper surface of the support layer pattern 106 and an upper surface of the lower insulation layer pattern 108 may be coplanar with each other, and may be substantially flat.

In various embodiments, the lower sacrificial layer structure 104 may include first to third lower sacrificial layers 104*a*, 104*b* and 104*c* sequentially stacked. In this case, the first lower sacrificial layer 104*a* and the third lower sacrificial layer 104*c* may include an oxide, e.g., silicon oxide, and the second lower sacrificial layer 104*b* may include, e.g., polysilicon or silicon nitride. For example, the lower sacrificial layer structure 104 may have a silicon oxide layer, a polysilicon layer, and a silicon oxide layer that are stacked.

In various embodiments, the support layer pattern 106 may include a material having an etch selectivity with respect to the first and third lower sacrificial layers 104*a* and 104*c*. The support layer pattern 106 may include, e.g., polysilicon.

In various embodiments, the lower insulation layer pattern 108 may include, e.g., silicon oxide.

Figure 2:
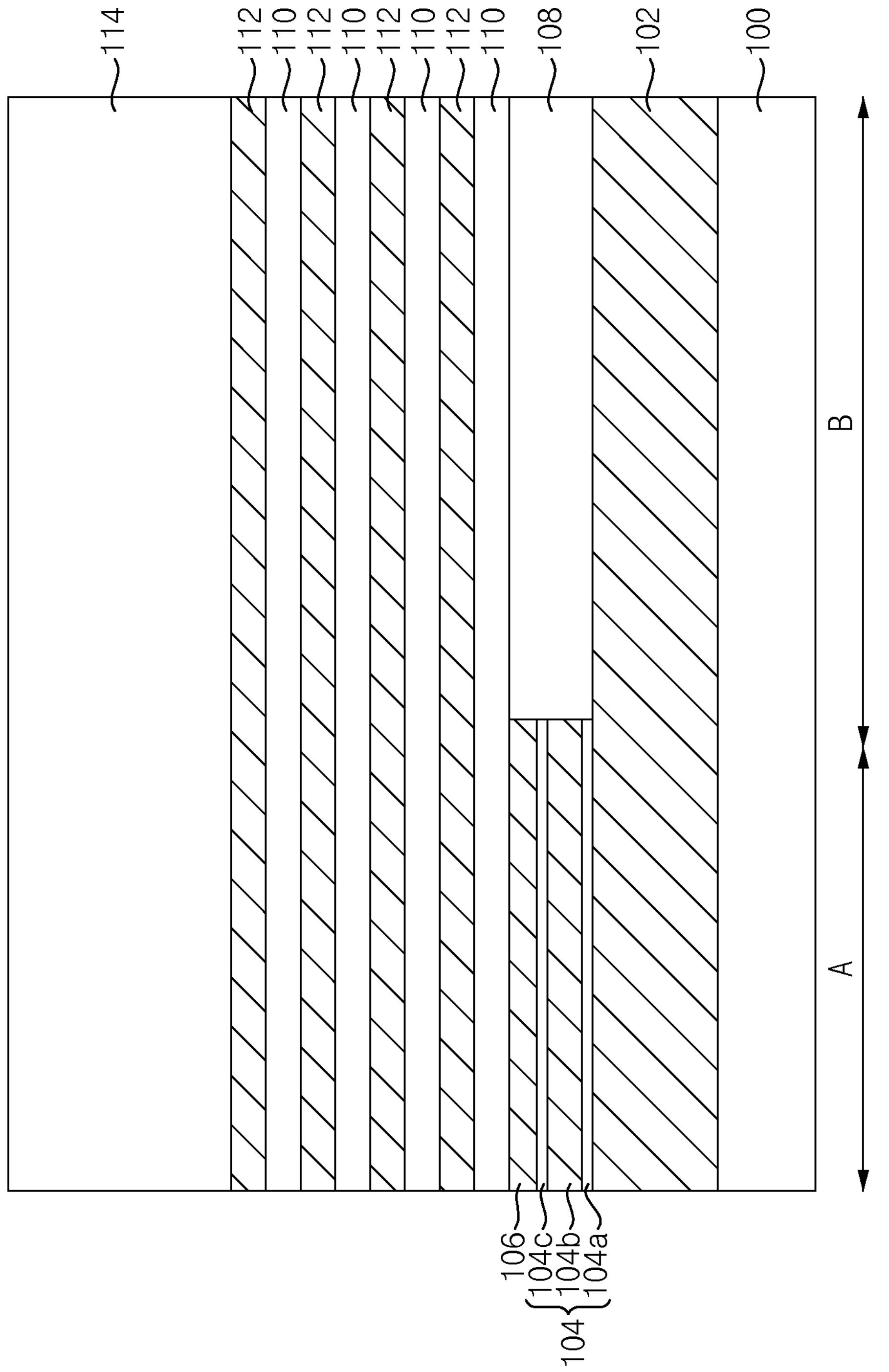

Referring to FIG. 2, an insulation layer 110 and a gate electrode layer 112 may be alternately and repeatedly stacked on the support layer pattern 106 and the lower insulation layer pattern 108.

In various embodiments, the insulation layer 110 and the gate electrode layer 112 may be formed by a chemical vapor deposition (CVD) process, a plasma chemical vapor deposition (PE-CVD) process, an atomic layer deposition (ALD) process, or the like. The insulation layer 110 may include, e.g., silicon oxide, and the gate electrode layer 112 may include, e.g., polysilicon. The polysilicon may be doped with impurities.

In various embodiments, a first insulating interlayer 114 may be formed on the uppermost gate electrode layer 112. The first insulating interlayer 114 may include, e.g., silicon oxide. The first insulating interlayer 114 may be formed to have a thickness greater than a thickness of each of the insulation layers 110.

Figure 3:
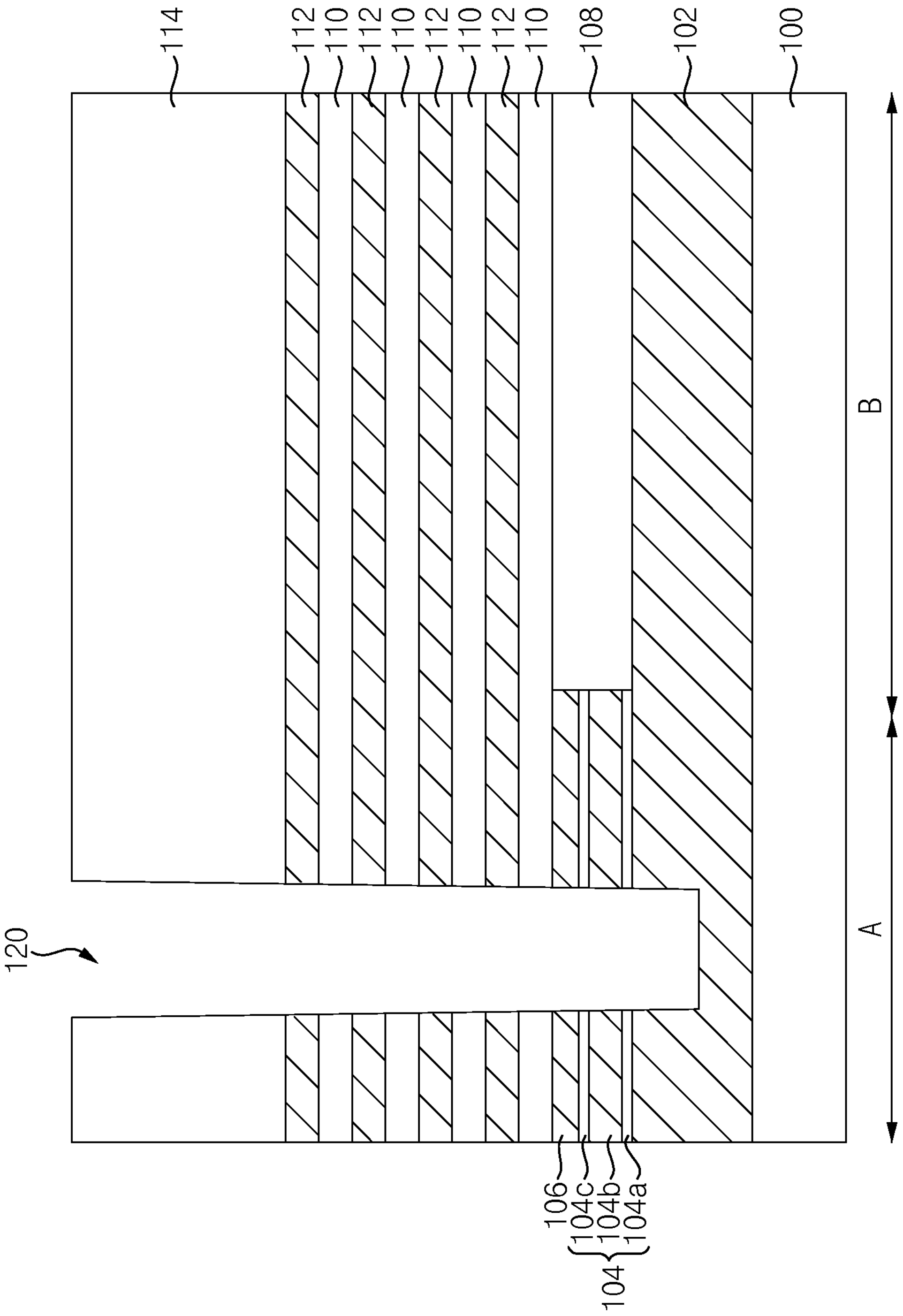
Figure 4:
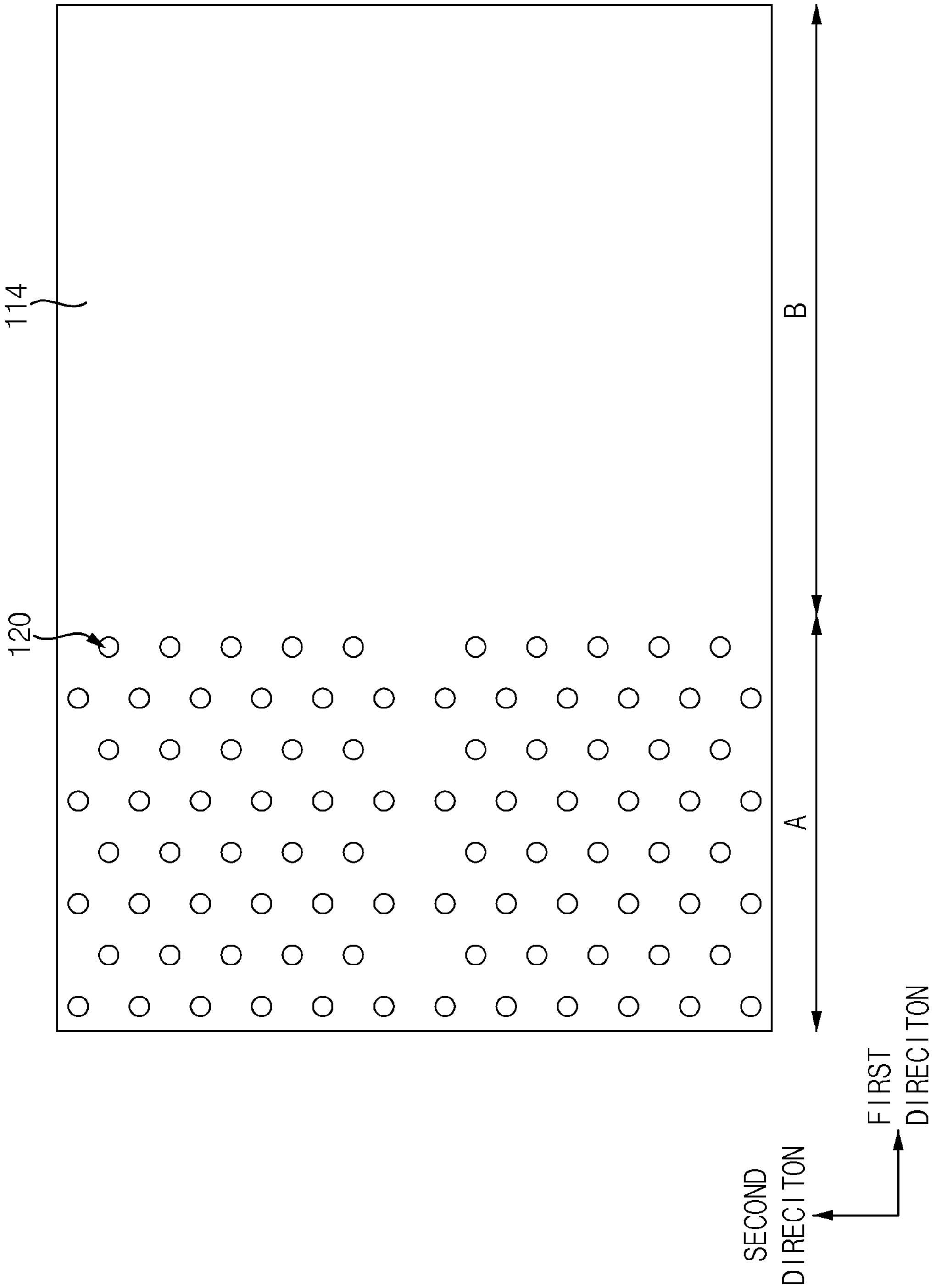

Referring to FIGS. 3 and 4, one or more channel holes 120 may be formed through the first insulating interlayer 114, the insulation layers 110, the gate electrode layers 112, the support layer pattern 106 and the lower sacrificial layer structure 104. Each of the channel holes may extend to an inner portion of the lower semiconductor layer 102. The channel holes 120 may not be formed in the second region B. Therefore, a dummy channel structure may not be formed in the second region B by subsequent processes.

In various embodiments, the lower semiconductor layer 102 may be exposed by a bottom surface and a lower sidewall of the channel hole 120. In order to avoid the complexity of the drawing, FIG. 3 shows only one channel hole 120, but as shown in FIG. 4, a plurality of channel holes 120 may be regularly arranged, where the channel holes 120 can be arranged in a first direction and a second direction. The plurality of channel holes 120 may be arranged in first region, A, where the plurality of channel holes 120 can have a regular spacing and pattern.

Figure 5:
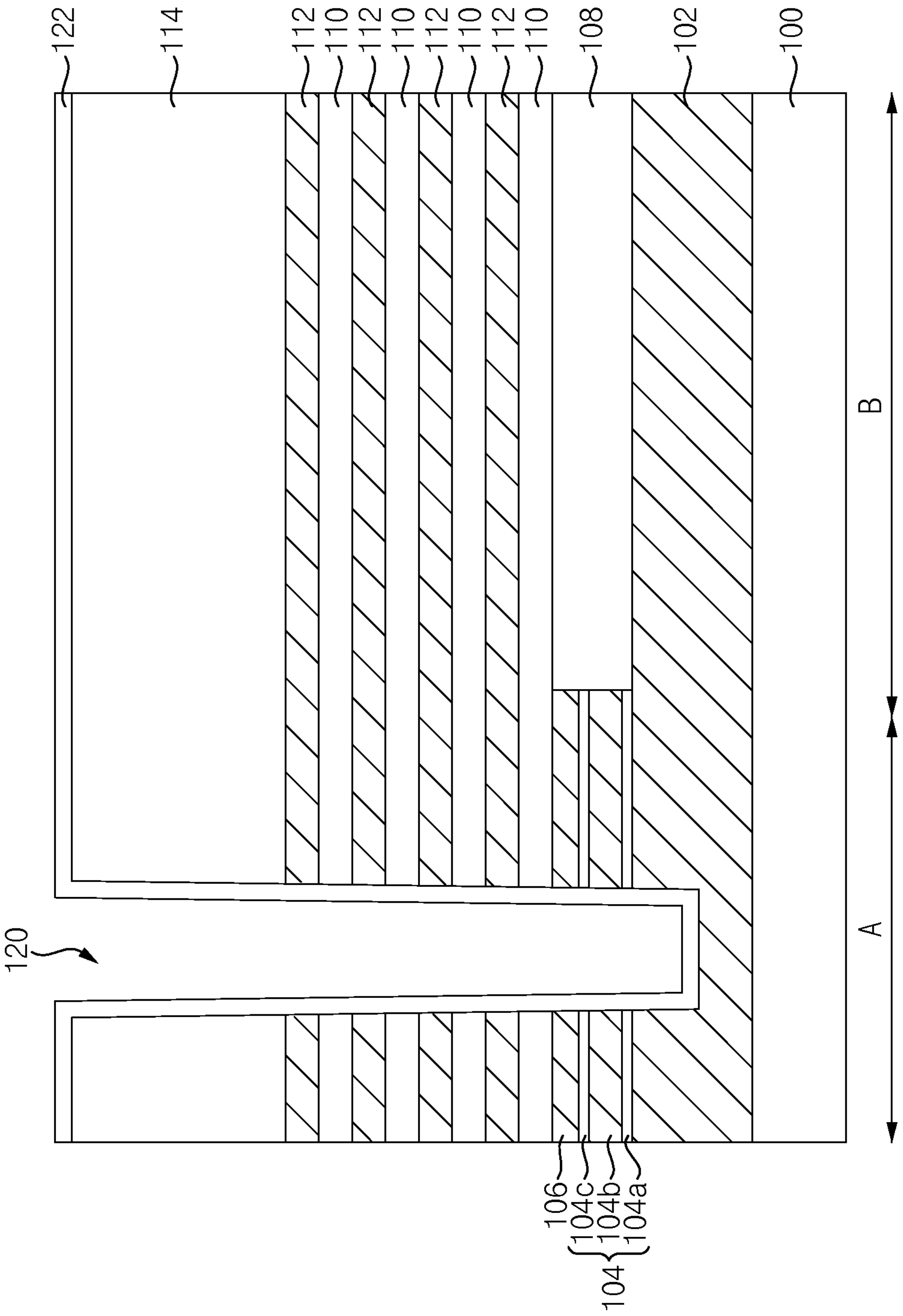

Referring to FIG. 5, a gate insulation layer 122 may be formed along a sidewall and the bottom surfaces of the channel hole 120 and an upper surface of the first insulating interlayer 114.

In various embodiments, the gate insulation layer 122 may include an oxide, e.g., silicon oxide. The gate insulation layer 122 may be formed by an ALD process.

Figure 6:
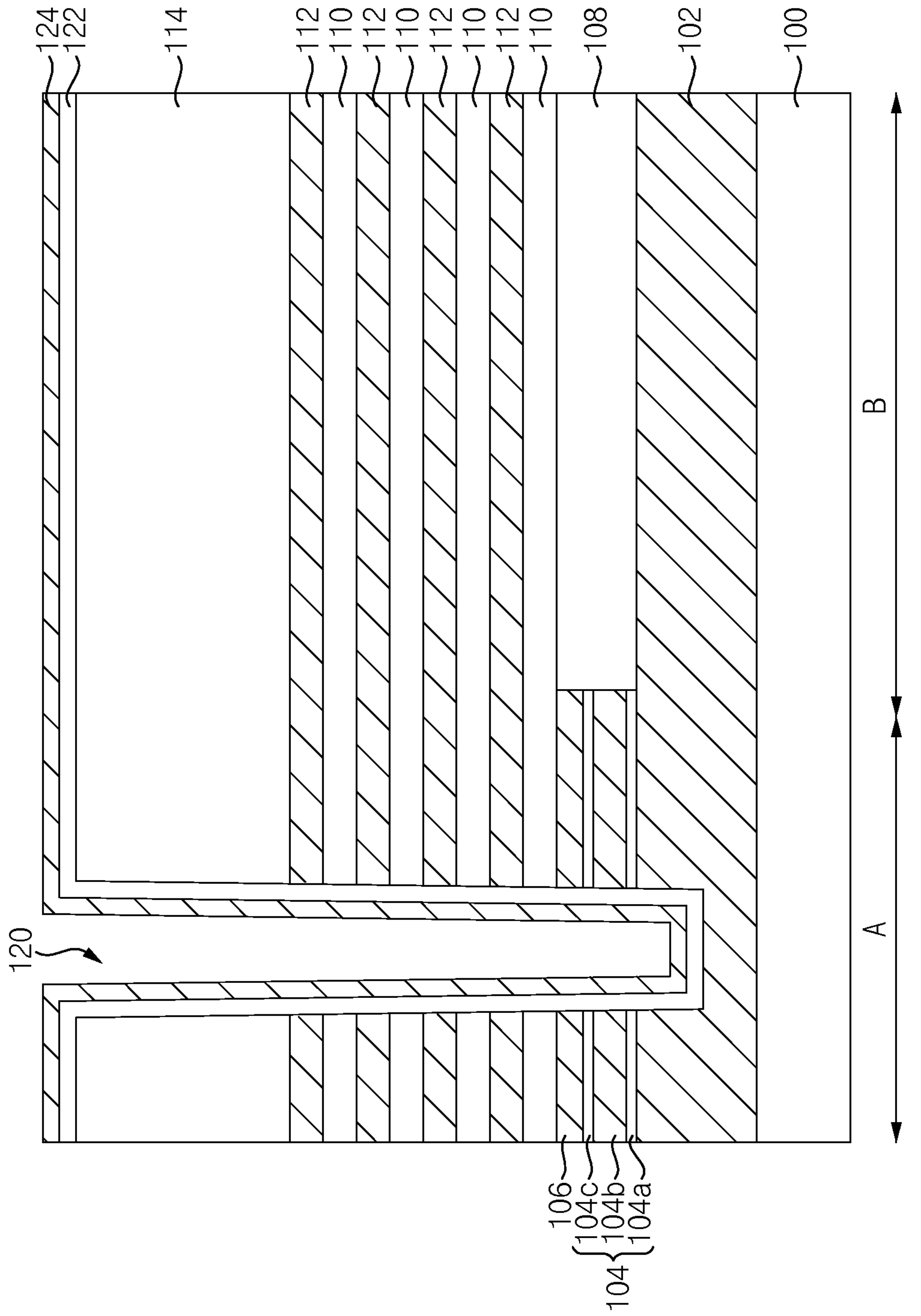

Referring to FIG. 6, a channel layer 124 may be formed along an upper surface of the gate insulation layer 122.

In various embodiments, the channel layer 124 may include polysilicon. In some example embodiments, the channel layer 124 may include crystalline silicon, e.g., single crystal silicon, or amorphous silicon. When the channel layer 124 includes amorphous silicon, the amorphous silicon may be converted into crystalline silicon by heat utilized or generated in subsequent processes. Alternatively, amorphous silicon may be converted into crystalline silicon by performing a laser epitaxial growth (LEG) process or a solid state epitaxy (SPE) process.

Figure 7:
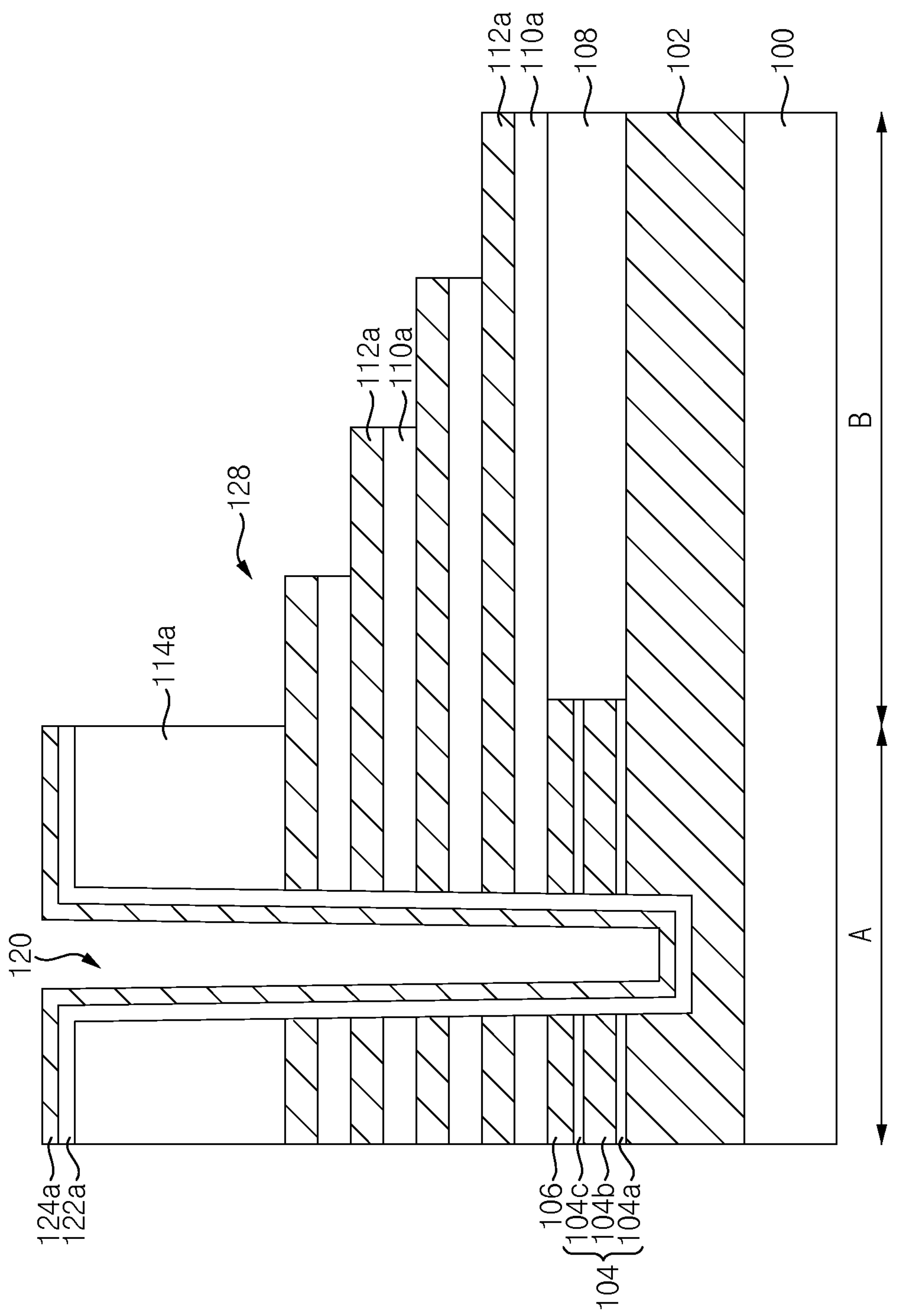
Figure 8:
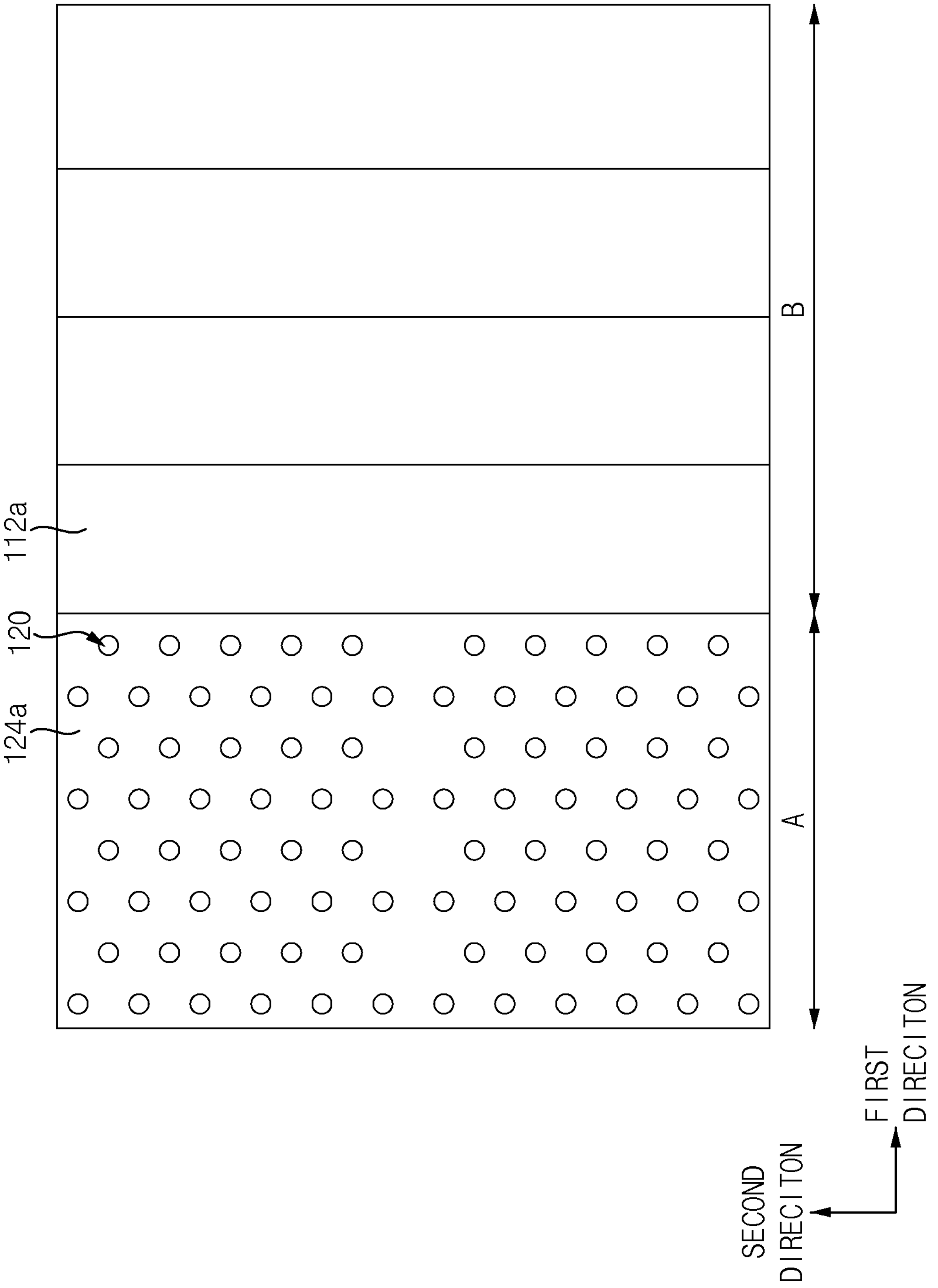

Referring to FIGS. 7 and 8, the channel layer 124, the gate insulation layer 122, the first insulating interlayer 114, the insulation layers 110, and the gate electrode layers 112 of the second region B may be patterned to form a first pattern structure 128 on the support layer pattern 106 and the lower insulation layer pattern 108. The first pattern structure 128 may be in the first region, A, and the second region, B.

In various embodiments, the first pattern structure 128 may include a structure in which a preliminary insulation layer pattern 110*a* and a preliminary gate pattern 112*a* are alternately stacked, and a first insulating interlayer pattern 114*a* is on the preliminary insulation layer pattern 110*a* and the preliminary gate pattern 112*a*. The first pattern structure 128 may have a step shape in the second region B.

Hereinafter, in each of the structures, a portion having the step shape in the second region B is referred to as a step portion including steps. In addition, each of the steps may include an exposed upper surface that is not covered by an upper layer and a vertical sidewall extending downwardly and connected from the exposed upper surface.

In various embodiments, a step portion of the first pattern structure 128 may expose upper surfaces of the preliminary gate patterns 112*a*.

In the patterning process for forming the first pattern structure 128, the channel layer 124, the gate insulation layer 122 and the first insulating interlayer 114 of the second region B may be removed. Accordingly, the first pattern structure 128 in the first region A may include the first insulating interlayer pattern 114*a*, a preliminary gate insulation layer pattern 122*a*, and a preliminary channel layer pattern 124*a*.

In various embodiments, an uppermost portion of the first pattern structure 128 in the first region A may expose the preliminary channel layer pattern 124*a*. An upper sidewall of the first pattern structure 128 at the interface between the first region, A, and the second region, B, may expose the first insulating interlayer pattern 114*a*, the preliminary gate insulation layer pattern 122*a*, and the preliminary channel layer pattern 124*a*.

In the second region B, the step portion of the first pattern structure 128 may expose upper surfaces of the preliminary gate patterns 112*a*. In addition, sidewalls of steps of the first pattern structure 128 may expose sidewalls of the preliminary gate patterns 112*a*, and sidewalls of the preliminary insulation layer patterns 110*a*.

As described above, after forming the channel holes 120, the gate insulation layer 122 and the channel layer 124, the first pattern structure 128 including the step portion may be formed by patterning process. The channel hole 120 may not be formed through the step portion of the first pattern structure 128. The channel hole may not be formed in the first pattern structure 128 of the second region B.

Figure 9:
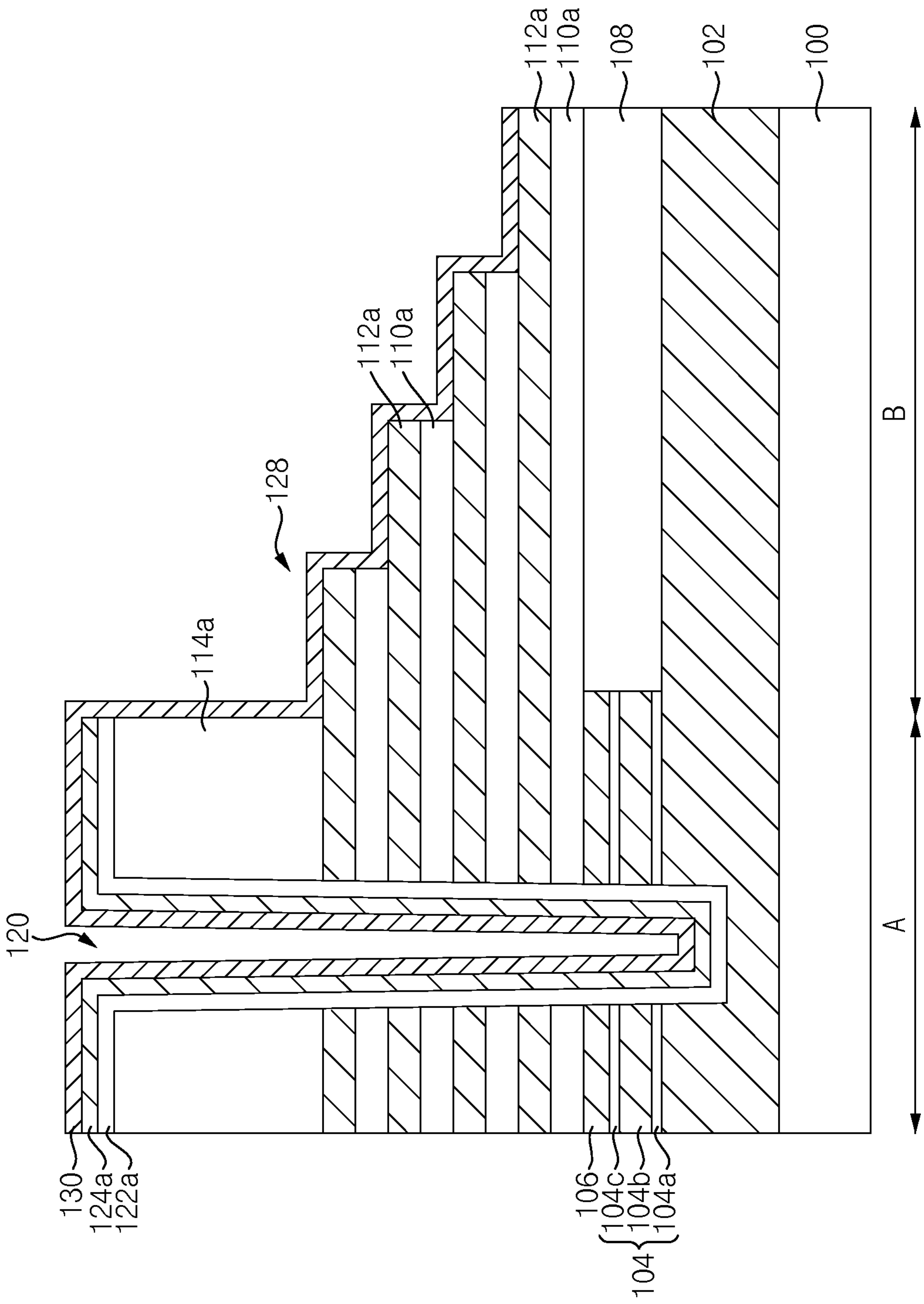

Referring to FIG. 9, a variable resistance layer 130 may be formed along a surface of the first pattern structure 128 in the first and second regions A and B.

In the first region A, the variable resistance layer 130 may be conformally formed on an upper surface of the preliminary channel layer pattern 124*a*, where the variable resistance layer 130 may be in physical contact with the upper surface of the preliminary channel layer pattern 124*a*. In the second region B, the variable resistance layer 130 may be formed along the upper surface and the sidewall of the preliminary gate pattern 112*a* and the sidewall of the preliminary insulation layer pattern 110*a*. In the interface between the first and second regions A and B, the variable resistance layer 130 may be formed on sidewalls of the first insulating interlayer pattern 114*a*, the preliminary gate insulation layer pattern 122*a*, and the preliminary channel layer pattern 124*a*. The variable resistance layer 130 can form a continuous layer over the exposed surfaces in first region, A, and second, region, B, where the variable resistance layer 130 can cover the interior surface of channel holes 120.

In various embodiments, where the channel hole 120 is not formed through the step portion of the first pattern structure 128, the variable resistance layer 130 may be continuously formed along a surface profile of the step portion of the first pattern structure 128.

In example embodiments, the variable resistance layer 130 may include a material whose electrical resistance changes due to oxygen vacancy or oxygen movement. The variable resistance layer 130 may include the material having a high etching selectivity with respect to silicon oxide. Also, the variable resistance layer 130 may include the material having a high etching selectivity with respect to the polysilicon.

For example, the variable resistance layer 130 may include a transition metal oxide, e.g., $HfO_2$, $RuO_2$, $MnO_2$, $CeO_2$, $V_2O_5$, NiO, $Co_2O_3$, $Ta_2O_5$, etc. The transition metal oxide may be used alone or in a combination of two or more transition metal oxides.

Figure 10:
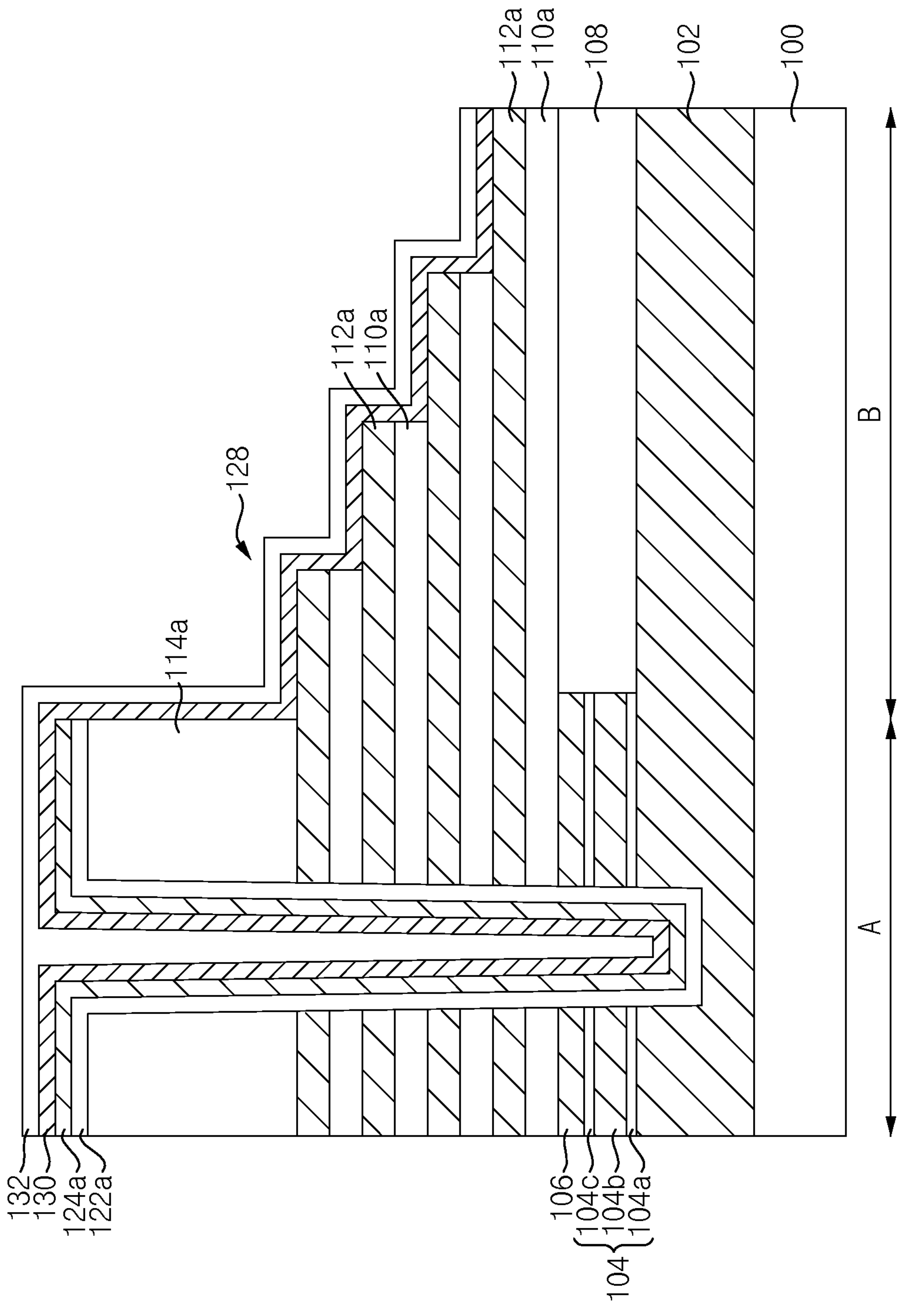

Referring to FIG. 10, a mask layer 132 may be formed on the variable resistance layer 130 to fill the channel holes 120. The mask layer may be conformally formed along the profile of the step portion of the first pattern structure 128.

In the second region B, the mask layer 132 may be formed along a surface profile of the preliminary gate patterns 112*a* and the preliminary insulation layer patterns 110*a* in the step portion. The mask layer 132 may include, e.g., silicon nitride. If the mask layer includes an oxide, the oxygen vacancy included in the variable resistance layer 130 may be decreased or removed during the deposition process of the mask layer. Therefore, the mask layer 132 may not include an oxide.

Figure 11:
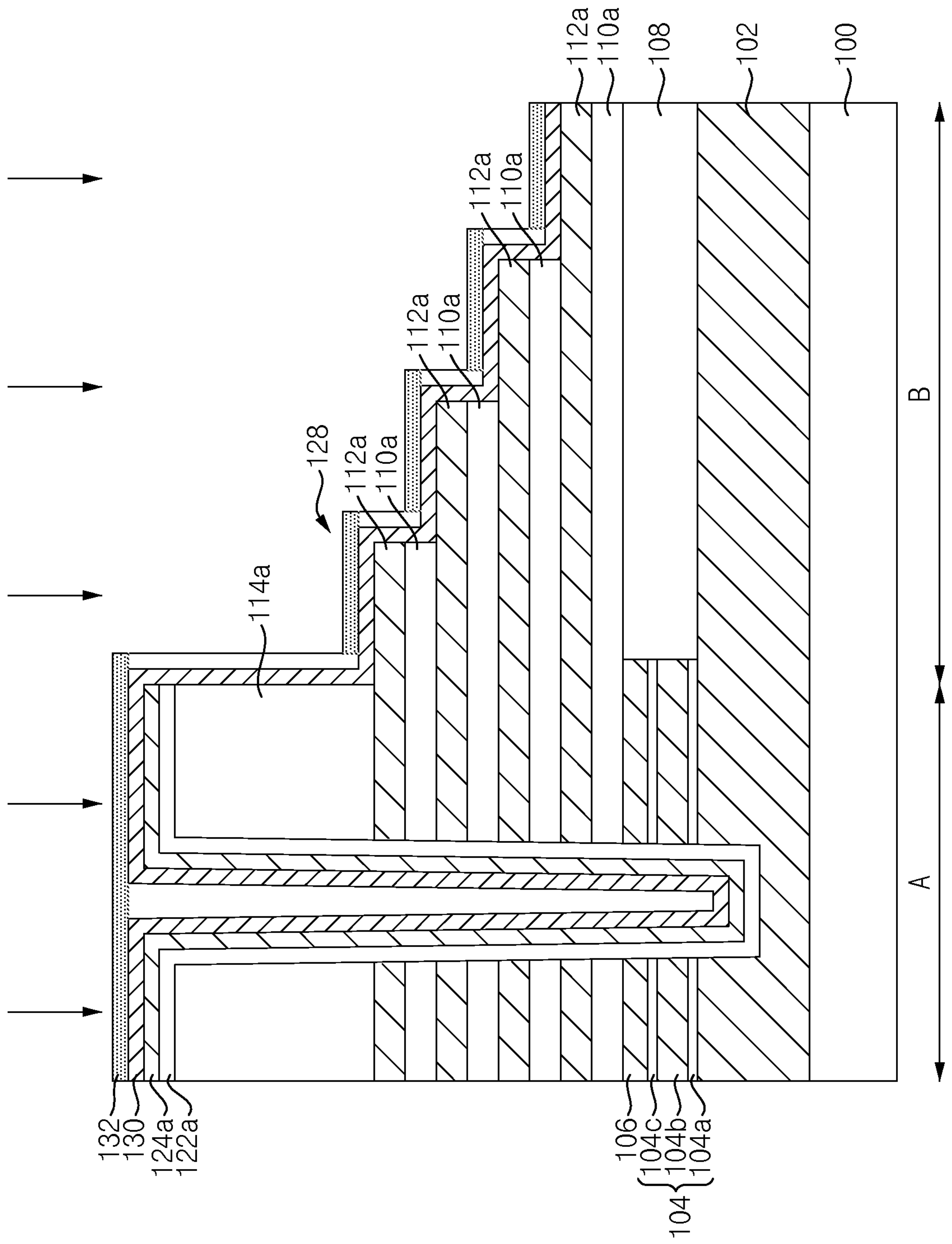

Referring to FIG. 11, a plasma treatment may be performed on the mask layer 132. The plasma may be straightly applied on the mask layer in the vertical direction.

In various embodiments, the mask layer 132 may include a plasma treated portion and a non-plasma treated portion, where the plasma treated portion may be hardened (i.e., cured) to have a higher etching resistance than the non-plasma treated portion.

In various embodiments, the mask layer 132 formed on a flat upper surface of the variable resistance layer 130 in the first region A may be hardened, and may be the plasma treated portion. In addition, the mask layer 132 formed on the upper surface of the step portion in the second region B may be hardened, and may be the plasma treated portion. However, the mask layer 132 formed on the sidewall of the step portion in the second region may not be hardened, and may be the non-plasma treated portion. The mask layer of the plasma treated portion may have an etching rate lower than an etching rate of the mask layer of the non-plasma treated portion.

Figure 12:
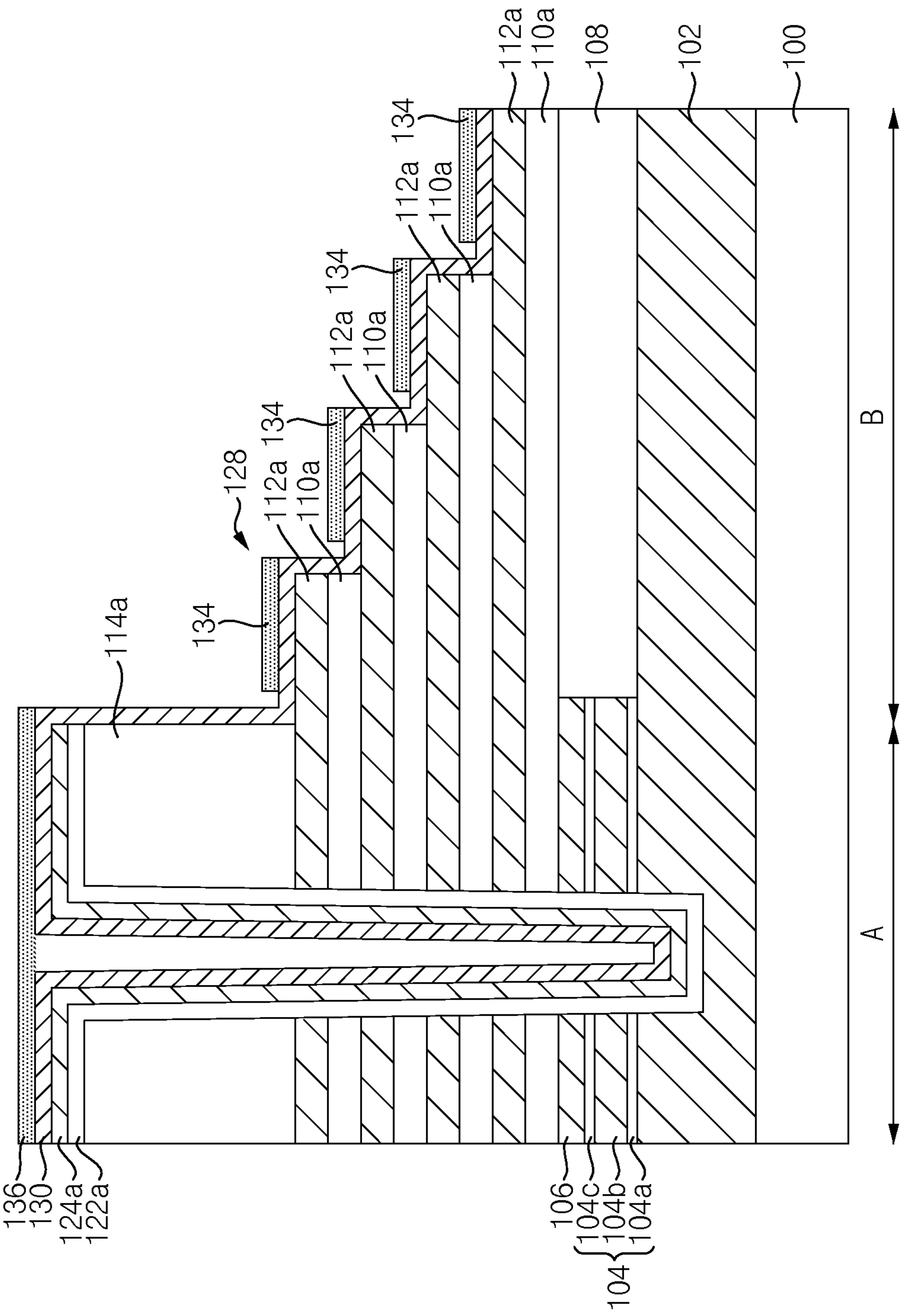

Referring to FIG. 12, the non-plasma treated portion of the mask layer 132 may be selectively removed. The removing process may include a wet etching process. In various embodiments, the removing process may include a wet etching process using hydrofluoric acid as an etchant.

By the removing process, the mask layer 132 formed on the variable resistance layer 130 of the sidewall of the step portion in the second region B may be selectively removed to from a mask pattern 134. The mask pattern 134 may be formed on the variable resistance layer 130 on the upper surfaces of the step portion.

An upper portion of the mask layer 132 on the variable resistance layer 130 in the first region A may be hardened, so that the plasma treated portion of the mask layer 132 in the first region A may cover a non-plasma treated portion of the mask layer 132 filling the channel hole 120, and the variable resistance layer 130. Therefore, the mask layer 132 on the variable resistance layer 130 in the first region A may not be removed by the etching process. Hereinafter, the mask layer 132 on the variable resistance layer 130 in the first region A, including the non-plasma treated portion and the plasma treated portion, may be referred to as a preliminary filling insulation pattern 136 filling the channel hole 120.

Figure 13:
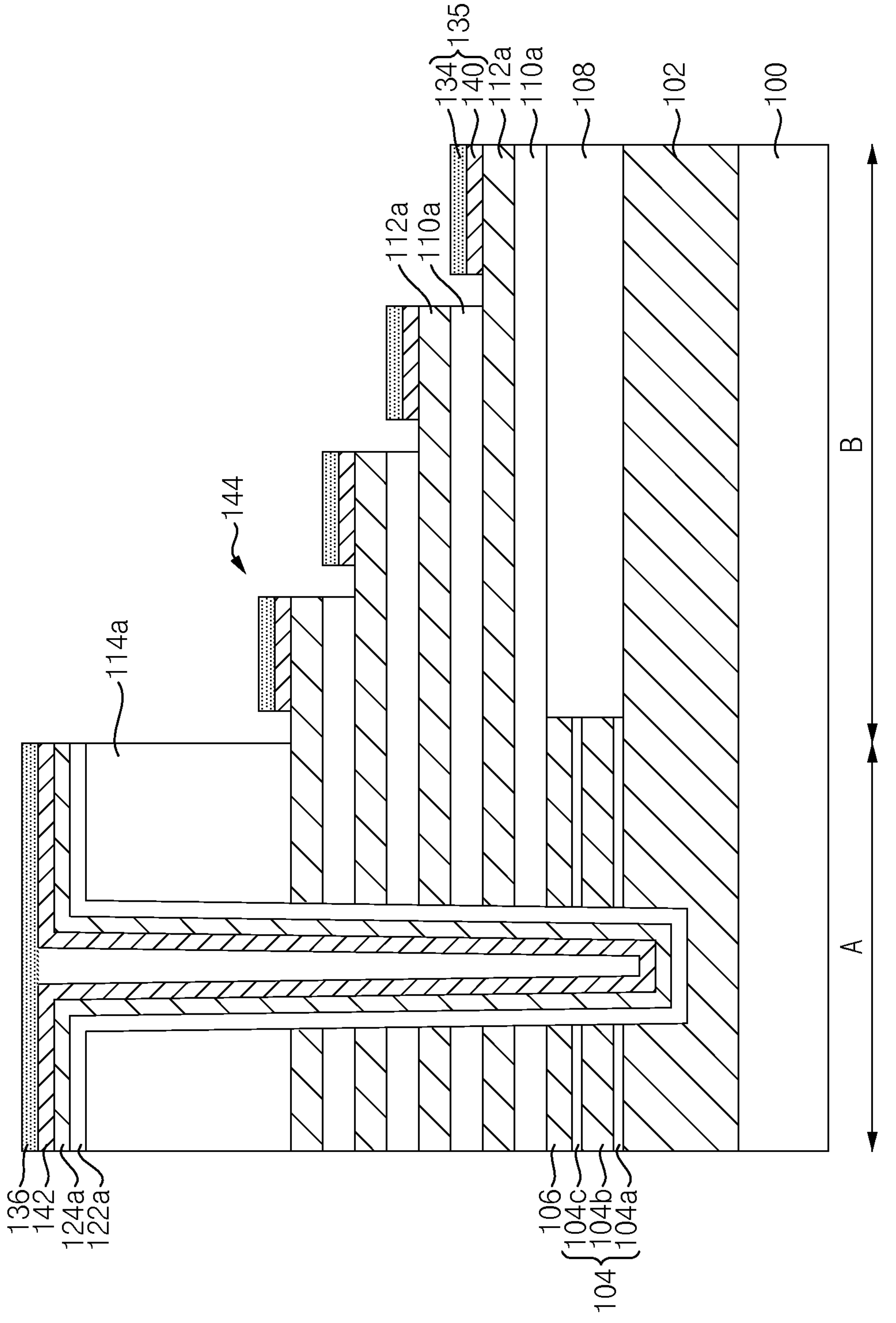

Referring to FIG. 13, the variable resistance layer 130 may be etched using the preliminary filling insulation pattern 136 and the mask pattern 134 as etching masks. The etching process of the variable resistance layer 130 may include a wet etching process.

In the etching process, the variable resistance layer 130 formed on the sidewall of the step portion in the second region B may be selectively removed to form a first variable resistance pattern 140 in the second region B. By the etching process, a second variable resistance pattern 142 may be formed below the preliminary filling insulation pattern 136 in the first region A.

In various embodiments, the first variable resistance pattern 140 and the mask pattern 134 may be stacked on the upper surface of the preliminary gate pattern 112*a* of the step portion in the second region B. A stacked structure including the first variable resistance pattern 140 and the mask pattern 134 may serve as an etch stop structure 135.

In various embodiments, the etch stop structures 135 may be formed on the upper surfaces of each of the preliminary gate patterns 112*a* of the step portion, respectively. Each of the etch stop structures 135 may not cover an entire surface of the preliminary gate pattern 112*a* of the step portion, but may cover only a portion of the upper surface of the preliminary gate pattern 112*a* of the step portion.

In various embodiments, the etch stop structure 135 on one step may be horizontally spaced apart from the adjacent sidewalls of the preliminary insulation layer pattern 110*a* and the preliminary gate pattern 112*a* positioned on the same underlying preliminary gate pattern 112*a* as the etch stop structure 135. The etch stop structure 135 may cover an edge portion in the first direction of the upper surface of the preliminary gate pattern 112*a* in each of the steps.

By the above process, a second pattern structure 144 may be formed on the support layer pattern 106 and the lower insulation layer pattern 108. The second pattern structure 144 may include a structure in which a preliminary insulation layer pattern 110*a* and a preliminary gate pattern 112*a* that are alternately stacked, the first insulating interlayer pattern 114*a* and the etch stop structure 135.

Figure 14:
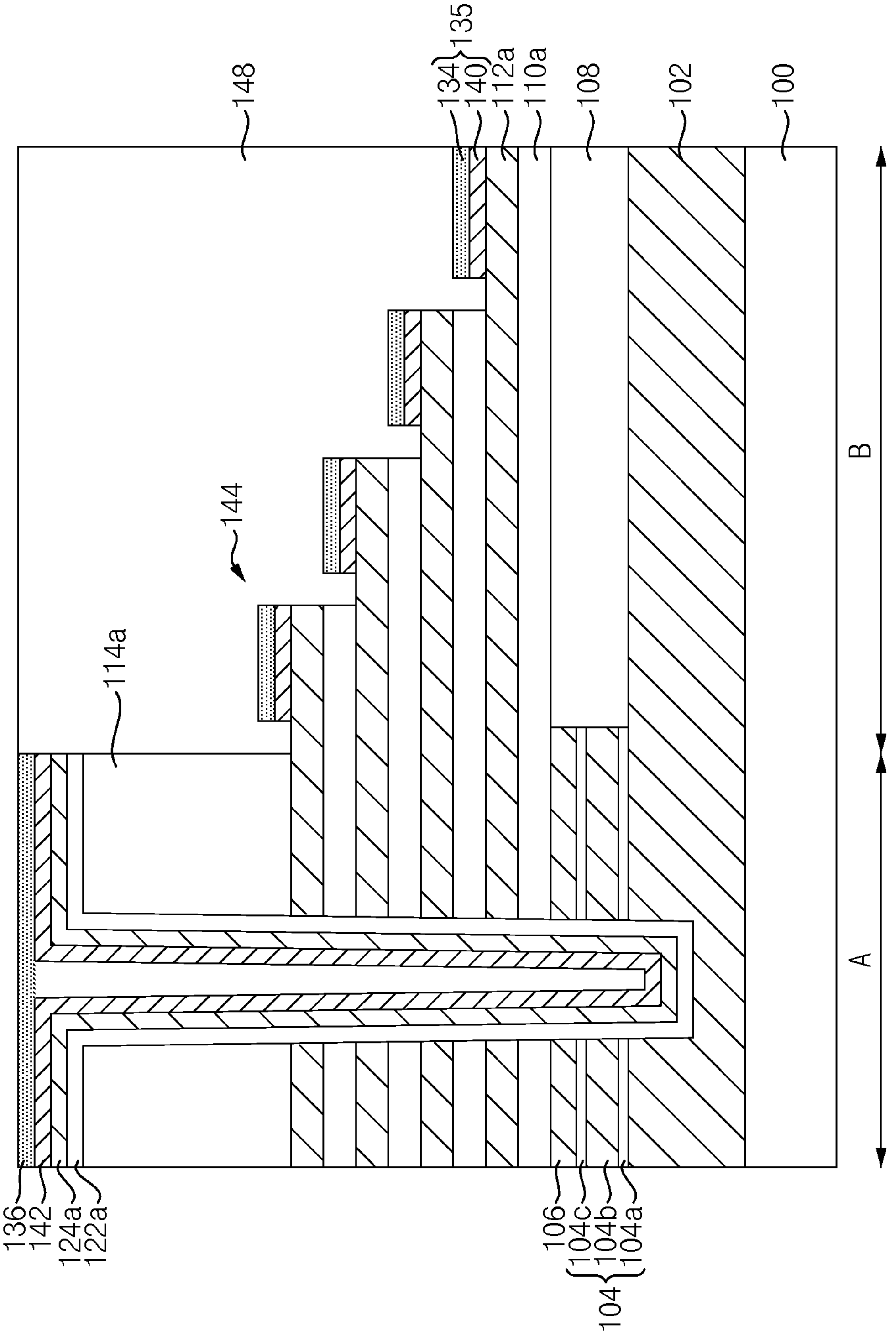

Referring to FIG. 14, a second insulating interlayer may be formed on the preliminary filling insulation pattern 136 and the second pattern structure 144 to sufficiently cover the second pattern structure 144.

In various embodiments, an upper surface of the second insulating interlayer formed on the second region B may be higher than an upper surface of the second pattern structure 144 formed on the first region A, where the second insulating interlayer can cover the preliminary filling insulation pattern 136. The second insulating interlayer may include silicon oxide. The second insulating interlayer may include, e.g., a tetraethoxysilane (TEOS) layer.

In various embodiments, the second insulating interlayer may be planarized until an upper surface of the preliminary filling insulation pattern 136 in the first region A may be exposed to form a second insulating interlayer pattern 148. The second insulating interlayer pattern 148 may cover a sidewall of the second pattern structure 144.

Figure 15:
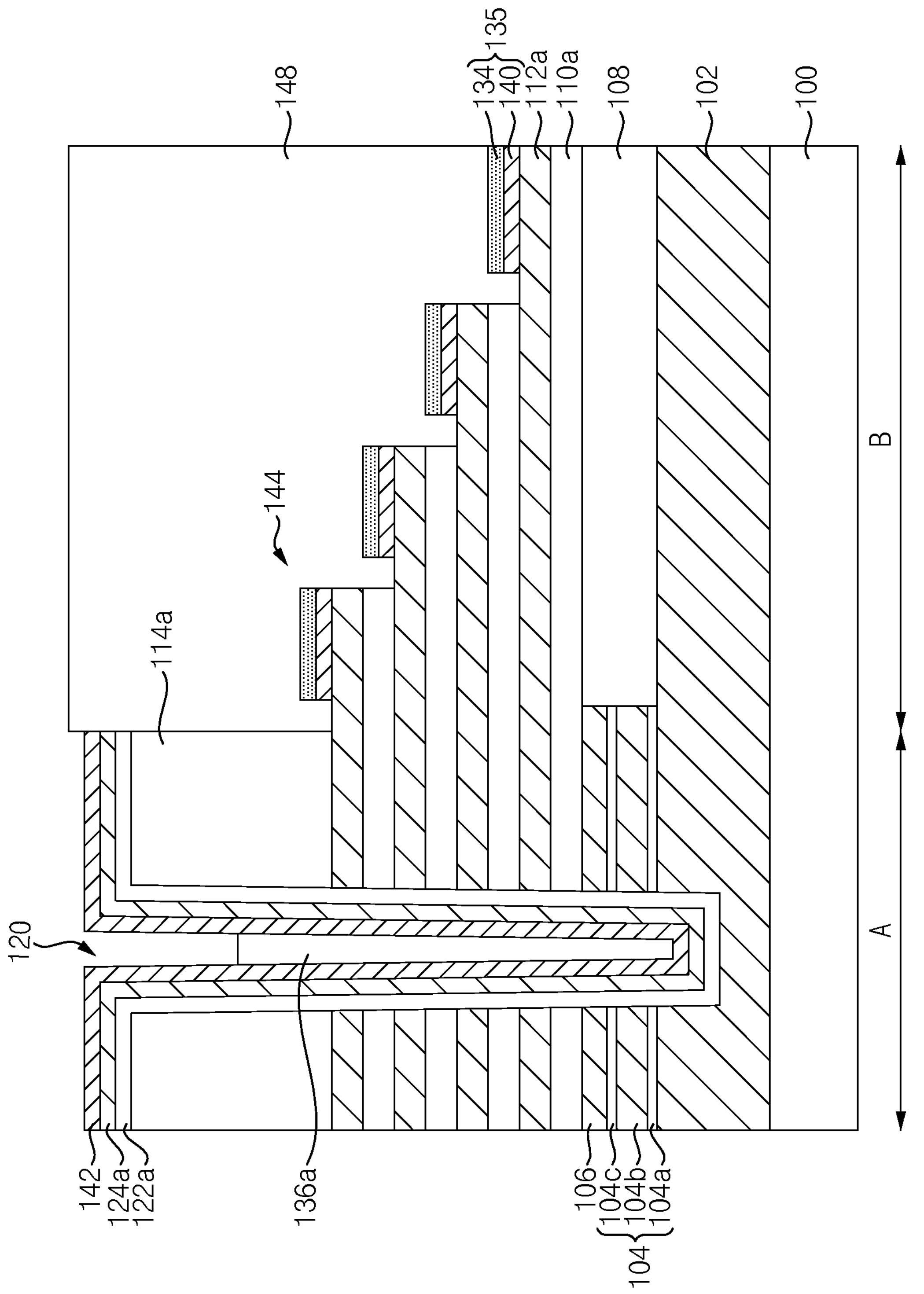

Referring to FIG. 15, the upper portion of the preliminary filling insulation pattern 136 in the first region may be removed by an etch-back process to form a first filling insulation pattern 136*a* in the channel hole 120. An upper surface of the first filling insulation pattern 136*a* may be higher than an upper surface of the preliminary gate pattern 112*a* positioned at an uppermost level.

In various embodiments, the second variable resistance pattern 142 may be exposed at a portion where the preliminary filling insulation pattern 136 is removed. The second variable resistance pattern 142 may be exposed at a portion above the upper surface of the first filling insulation pattern 136*a* in the first region A.

Figure 16:
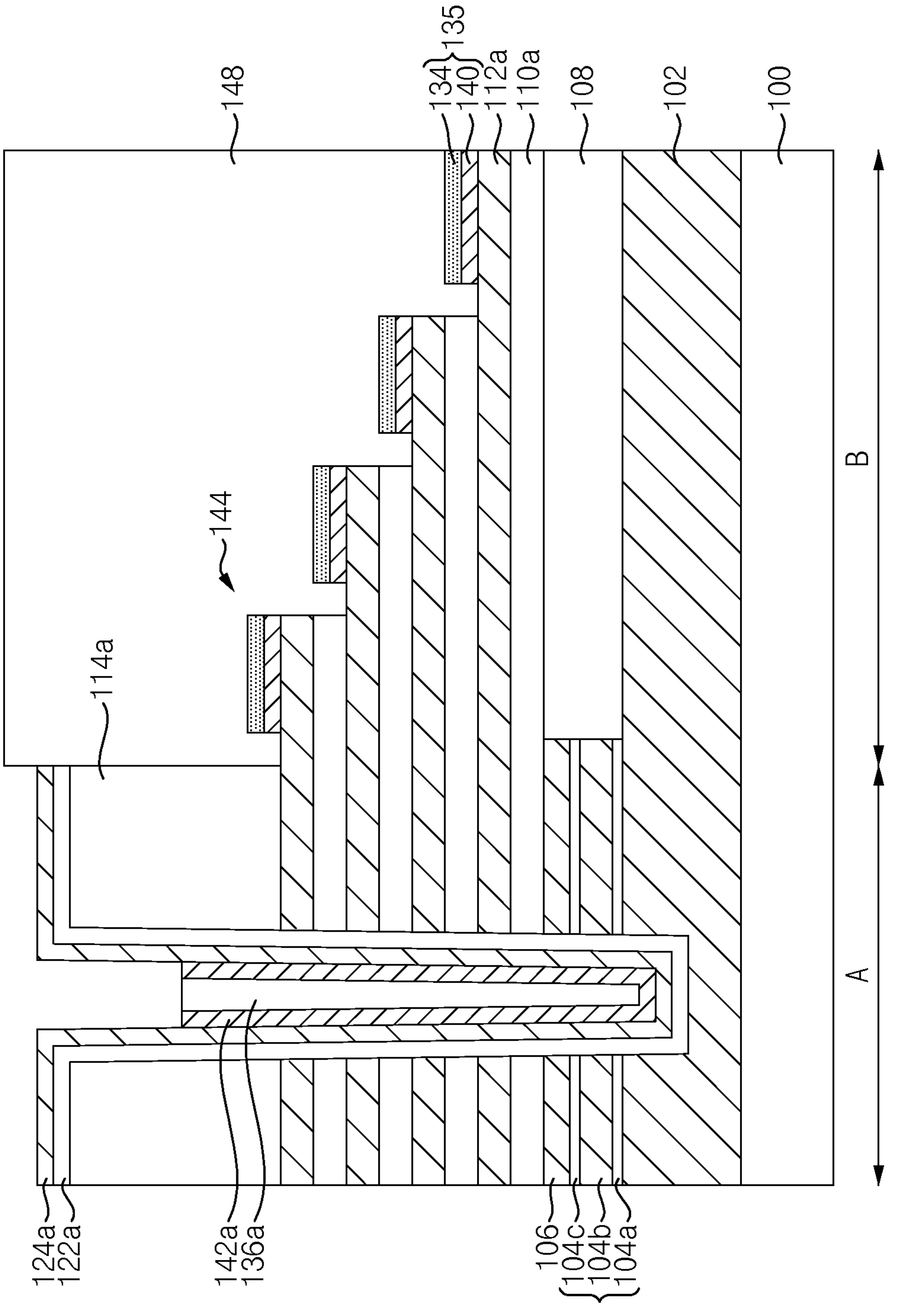

Referring to FIG. 16, an exposed portion of the second variable resistance pattern 142 may be removed to form a cell variable resistance pattern 142*a* in the channel hole 120. The cell variable resistance pattern 142*a* may be in physical contact with the first filling insulation pattern 136*a* and the preliminary channel layer pattern 124*a*, respectively. The cell variable resistance pattern 142*a* may be formed between the first filling insulation pattern 136*a* and the preliminary channel layer pattern 124*a*.

As the second variable resistance pattern 142 is partially removed, an upper portion of the preliminary channel layer pattern 124*a* may be exposed. The preliminary channel layer pattern 124*a* may be exposed at a portion above the cell variable resistance pattern 142*a* in the first region A.

Figure 17:
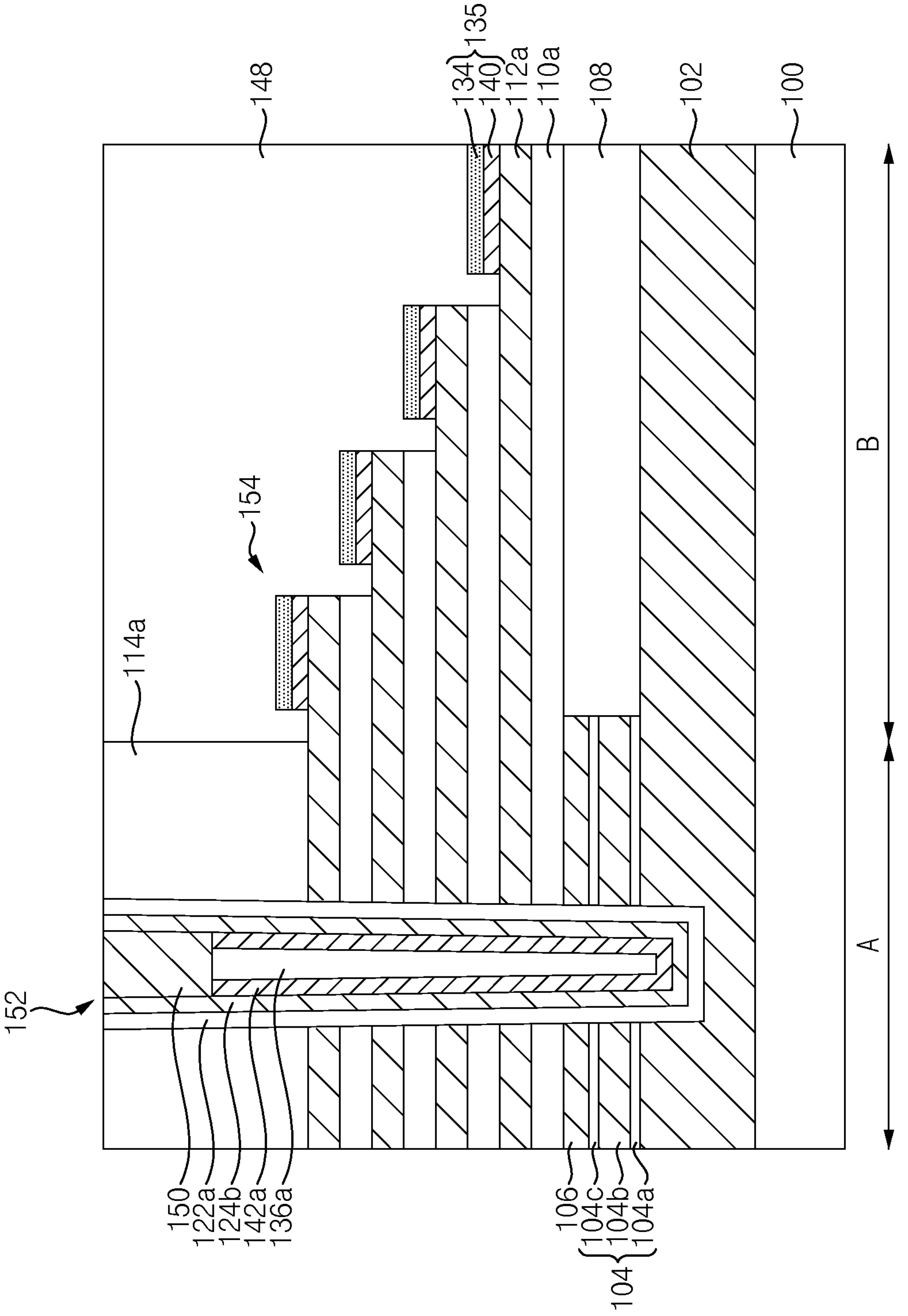

Referring to FIG. 17, an upper pad layer may be formed on the preliminary channel layer pattern 124*a*, the first filling insulation pattern 136*a*, the cell variable resistance pattern 142*a* and the second insulating interlayer pattern 148 to fill the channel hole 120. In various embodiments, the upper pad layer may include polysilicon.

A planarization process may be performed until an upper surface of the first insulating interlayer pattern 114*a* may be exposed. By the planarization process, the upper pad layer, the preliminary channel layer pattern 124*a* and the preliminary gate insulation layer pattern 122*a* positioned on the upper surfaces of the first insulating interlayer pattern 114*a* and the second insulating interlayer pattern 148 may be removed to form a preliminary channel structure 152 filling the channel hole 120.

In various embodiments, the preliminary channel structure 152 may include a preliminary gate insulation layer pattern 122*a*, a channel 124*b*, the cell variable resistance pattern 142*a*, the first filling insulation pattern 136*a*, and an upper pad 150.

By the above process, a third pattern structure 154 may be formed on the support layer pattern 106 and the lower insulation layer pattern 108. The third pattern structure 154 may include the structure in which a preliminary insulation layer pattern 110*a* and a preliminary gate pattern 112*a* are alternately stacked, the first insulating interlayer pattern 114*a*, the preliminary channel structure, and the etch stop structure 135.

Figure 18:
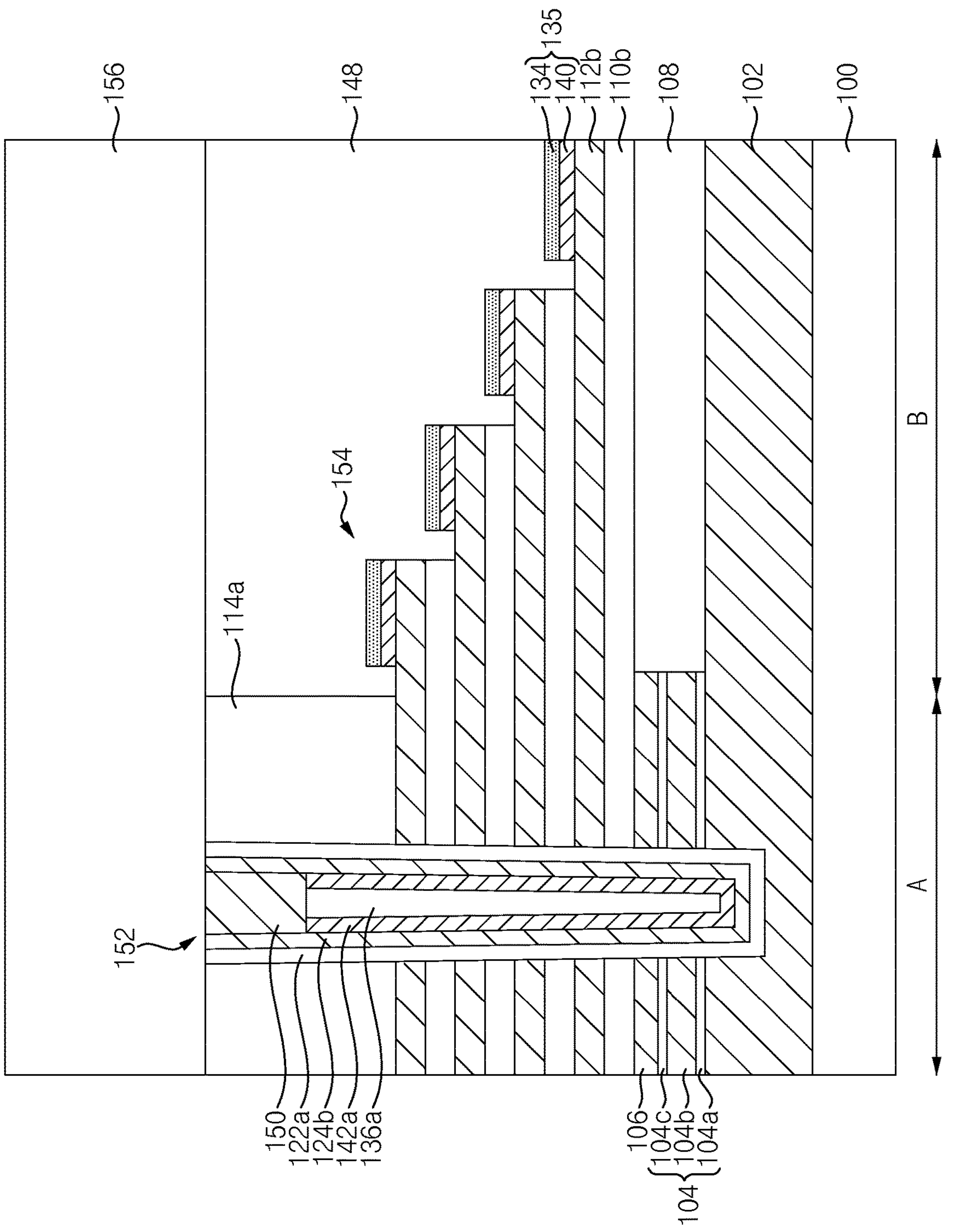
Figure 19:
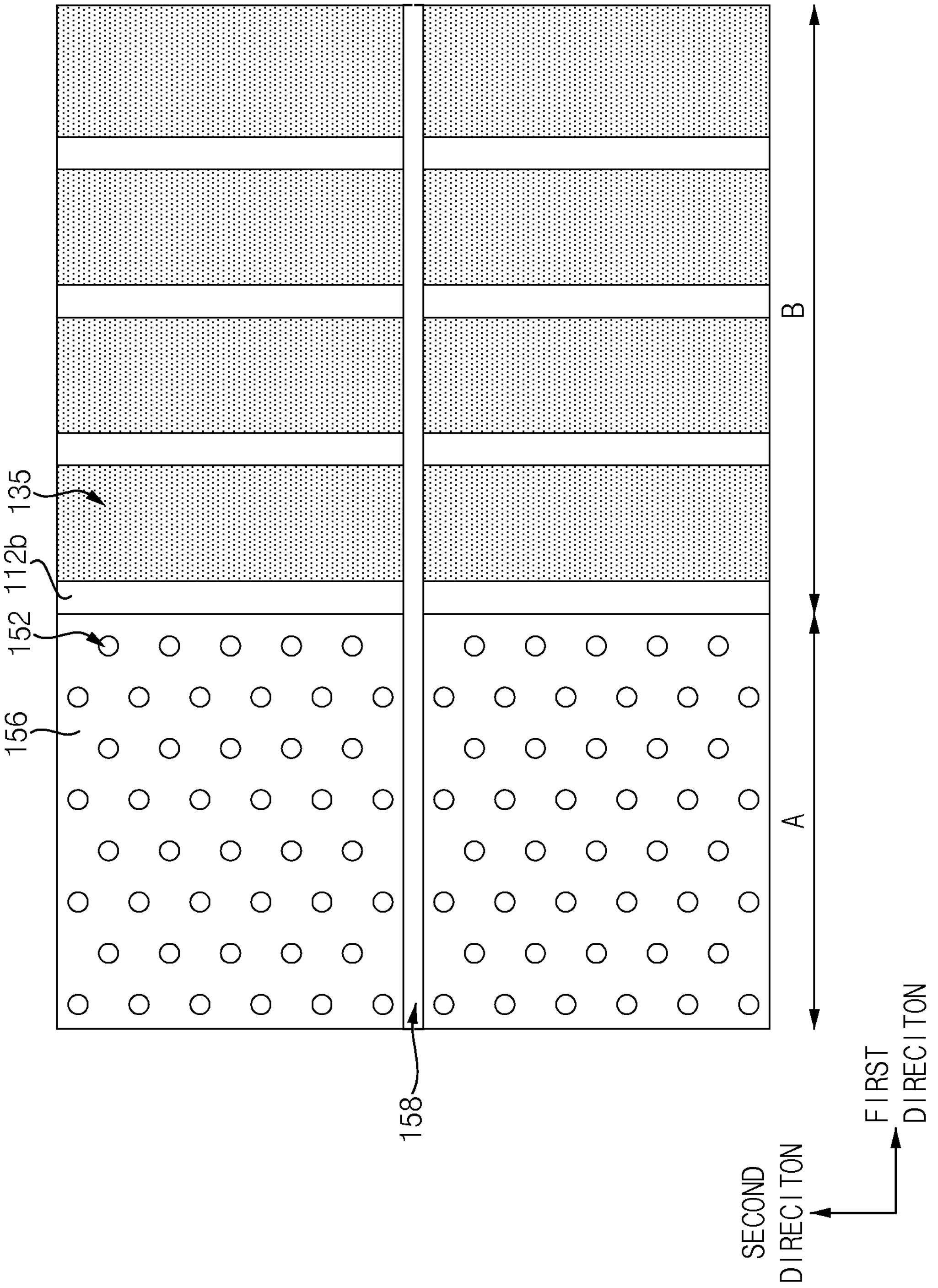

Referring to FIGS. 18 and 19, a third insulating interlayer 156 may be formed on the first insulating interlayer pattern 114*a*, the preliminary channel structure 152, and the second insulating interlayer pattern 148.

In various embodiments, the third insulating interlayer 156, the second insulating interlayer pattern 148, the third pattern structure 154, the support layer pattern 106, and the lower sacrificial layer structure 104 may be etched to form a trench 158 extending in the first direction. The lower sacrificial layer structure 104 may be exposed by a bottom surface and a lower sidewall of the trench 158. For example, the bottom surface of the trench 158 may expose the second lower sacrificial layer 104*b*. The lower semiconductor layer 102 may not be exposed by the bottom surface of the trench 158.

In various embodiments, the third pattern structure 154 may be separated by the trench 158 to form a plurality of third pattern structures. Therefore, the preliminary insulation layer pattern 110*a* and the preliminary gate pattern 112*a* may be separated by the trench to form an insulation layer pattern 110*b* and a gate pattern 112*b*.

Spacers may be formed on sidewalls of the trench 158. The spacer may be formed to expose the lower sacrificial layer structure 104 on a lower sidewall and a bottom of the trench 158. The spacer may cover the support layer pattern 106, the insulation layer pattern 110*b*, the gate pattern 112*b*, the first and second insulating interlayer patterns 114*a* and 148 and the third insulating interlayer 156 corresponding to an upper sidewall of the trench 158.

Figure 20:
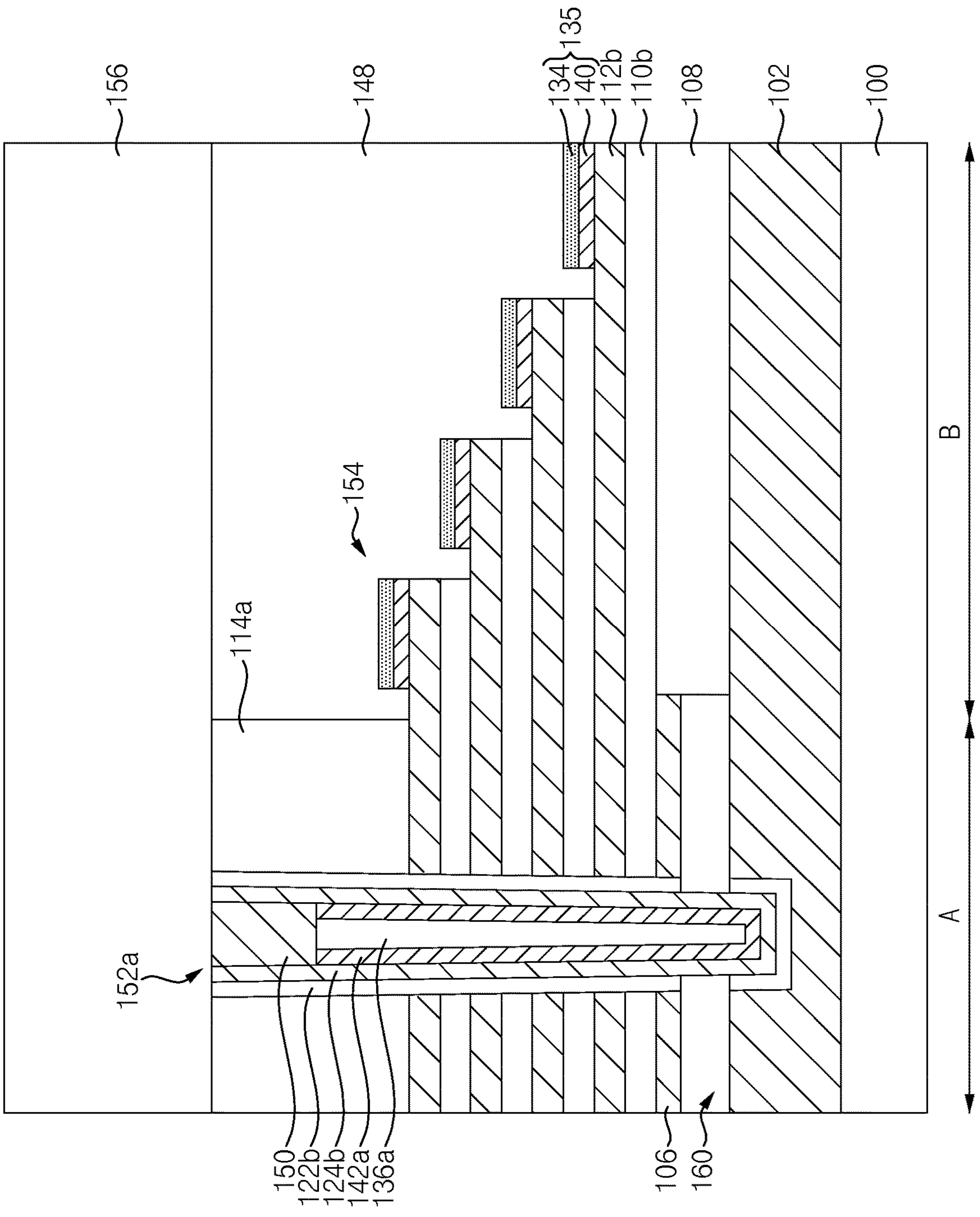

Referring to FIG. 20, the lower sacrificial layer structure 104 exposed on the lower sidewall of the trench 158 may be removed, which can expose a portion of a sidewall of the preliminary gate insulation layer pattern 122*a* included in the preliminary channel structure 152. The exposed portion of the preliminary gate insulation layer pattern 122*a* may be removed, where the removed portions of the lower sacrificial layer structure 104 and preliminary gate insulation layer pattern 122*a* can form a gap 160. The gap 160 may be formed between an upper surface of the lower semiconductor layer 102 and a lower surface of the support layer pattern 106. A portion of the sidewall of the channel 124*b* may be exposed within gap 160 by removal of the portion of preliminary gate insulation layer pattern 122*a*.

In various embodiments, a portion of a sidewall of the channel 124*b* may be exposed by the gap 160. The upper surface of the lower semiconductor layer 102 may be exposed by the gap 160. In addition, a portion of the preliminary gate insulation layer pattern 122*a* formed on the lower sidewall of the channel hole 120 may be removed to form a gate insulation layer pattern 122*b*. Accordingly, a channel structure 152*a* may be formed in the channel hole 120. The channel structure 152*a* may include the gate insulation layer pattern 122*b*, the channel 124*b*, the cell variable resistance pattern 142*a*, the first filling insulation pattern 136*a*, and the upper pad 150.

In various embodiments, the second lower sacrificial layer 104*b* included in the lower sacrificial layer structure 104 may be initially removed. Next, the first sacrificial layer 104*a* and the third lower sacrificial layer 104*c* positioned on and below the second lower sacrificial layer pattern 104*b* may be subsequently removed. When the first and third lower sacrificial layer 104*a* and 104*c* include silicon oxide, the exposed portion of the preliminary gate insulation layer pattern 122*a* may be removed together with the first and third lower sacrificial layer 104*a* and 104*c* in the same process. Each of the removing processes may include isotropic etching process, e.g., a wet etching process.

Figure 21:
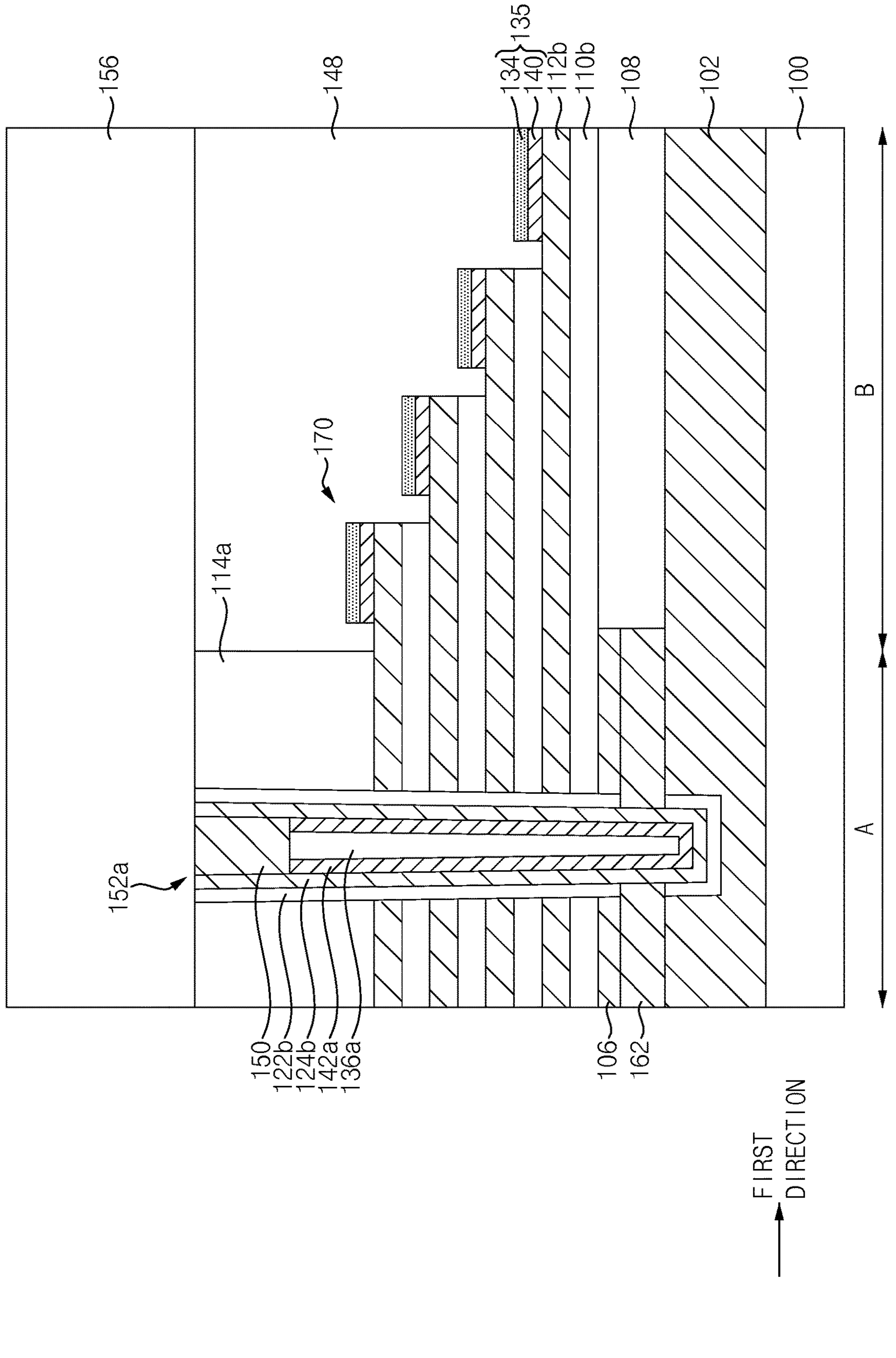

Referring to FIG. 21, a channel connection pattern 162 may be formed to fill the gap 160. The channels 124*b* formed in channel holes 120 may be electrically connected to each other by the channel connection pattern 162. Further, the channels 124*b* may be electrically connected to the lower semiconductor layer 102.

In various embodiments, the channel connection pattern 162 may include polysilicon doped with impurities.

In various embodiments, the spacer may be removed. The lower sacrificial layer structure 104 on the bottom of the trench 158 may be removed to expose the lower semiconductor layer 102 on the bottom of the trench 158. Thereafter, a second filling insulation pattern may be formed to fill the trench 158. The second filling insulation pattern may include, e.g., silicon oxide.

Accordingly, a cell stacked structure 170 in which the insulation layer pattern 110*b* and the gate pattern 112*b* are alternately and repeatedly stacked may be formed on the support layer pattern 106 and the lower insulation layer pattern 108. The cell stacked structure 170 may extend in the first direction, and an edge portion in the first direction of the cell stacked structure may have a step shape. The etch stop structure 135 may be formed on a step portion of the cell stacked structure 170. In addition, the channel structure 152*a* may pass through the cell stacked structure 170 in the first region, and may extend into the lower semiconductor layer 102. In various embodiments, the cell stacked structure is disposed in the second region and has a step portion having a step shape.

Figure 22:
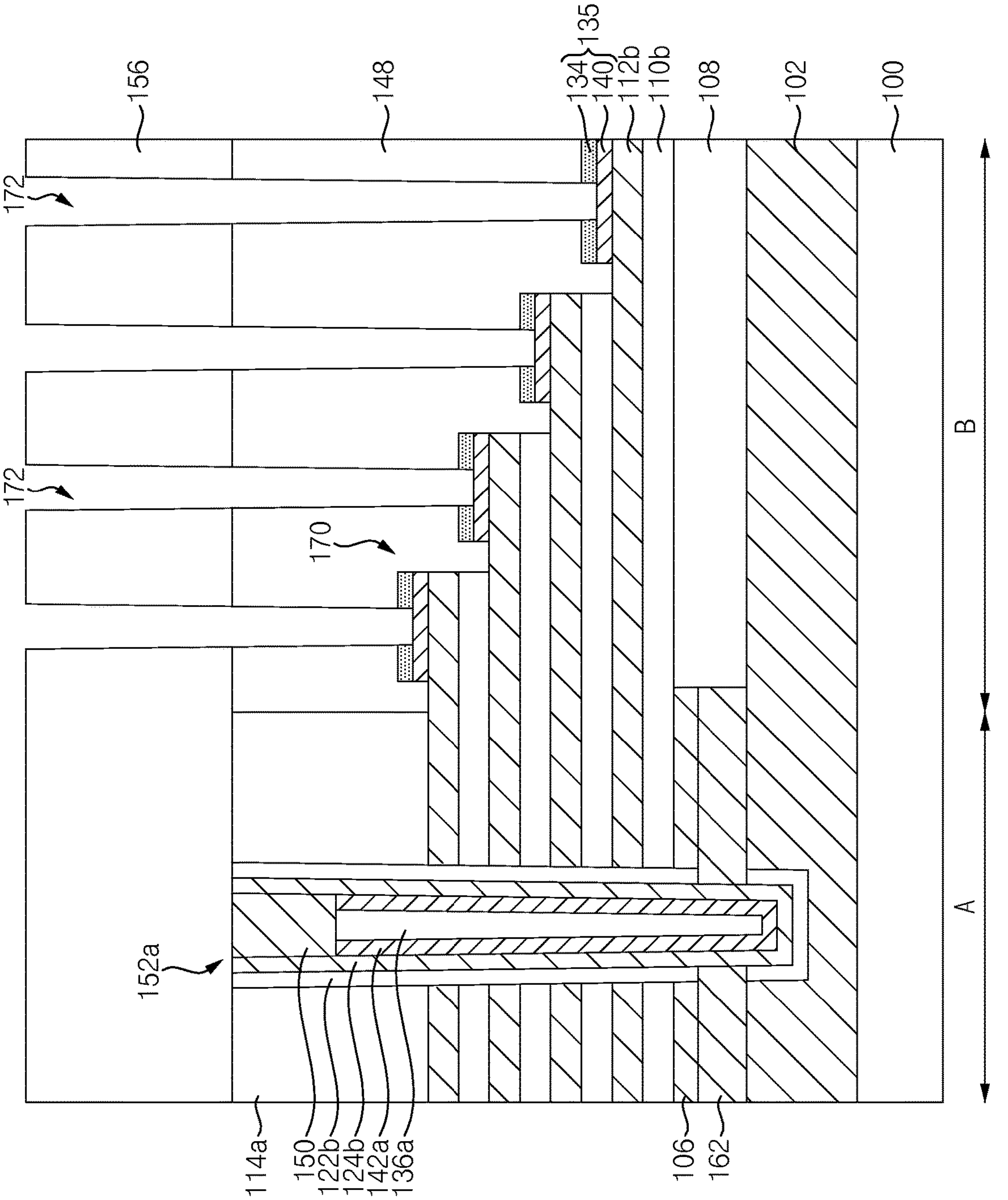

Referring to FIG. 22, an etching mask pattern may be formed on the third insulating interlayer 156. The third insulating interlayer 156, the second insulating interlayer pattern 148, and the mask pattern 134 in the second region B may be etched using the etching mask to form preliminary contact holes 172. The preliminary contact holes 172 may expose the first variable resistance pattern 140 positioned on the upper surfaces of the steps. The etching process may include an anisotropic etching process.

In various embodiments, the first variable resistance pattern 140 in the second region B may be used as an etch stop layer in the etching process for forming the preliminary contact holes 172. The first variable resistance pattern 140 in the second region B may not serve as a variable resistance.

In various embodiments, the preliminary contact holes 172 formed on each of the steps may have different vertical depths, where the depth of the preliminary contact hole can be determined by the step on which the first variable resistance pattern 140 is located. For example, the depth of the preliminary contact hole 172 formed on a first step may be greater than the depth of the preliminary contact hole 172 formed on a step on a higher layer than the first step. Therefore, the preliminary contact hole 172 positioned on a high step may excessively extend into a step positioned below a target step due to over etching. That is, a punching failure of the preliminary contact holes 172 may occur. In addition, the preliminary contact hole 172 positioned on a lower level may not expose the first variable resistance pattern 140 of a target step. That is, not open failure of the preliminary contact holes 172 may occur.

However, in various embodiments, the first variable resistance pattern 140 may be hardly etched in the etching process of the third insulating interlayer 156, the second insulating interlayer pattern 148, and the mask pattern 134 for forming the preliminary contact holes 172. The first variable resistance pattern 140 has a high etching selectivity with respect to silicon oxide, so that the first variable resistance pattern 140 may not be etched in the etching process of the silicon oxide. Therefore, the third insulating interlayer 156, the second insulating interlayer pattern 148, and the mask pattern 134 can be etched to expose the first variable resistance pattern 140 to form the preliminary contact holes 172, so that the punching failure or not opening failure do not occur.

Figure 23:
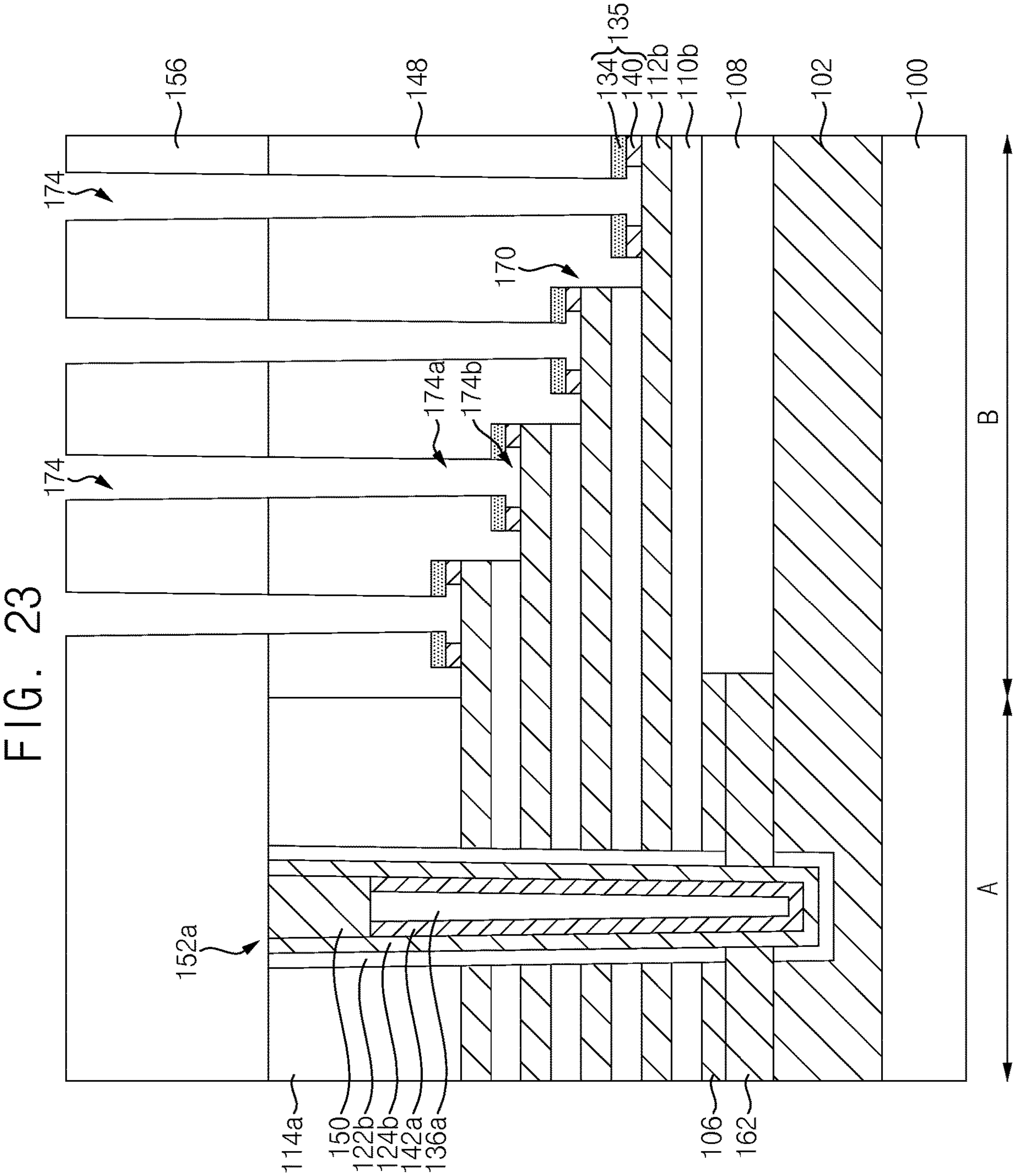

Referring to FIG. 23, the first variable resistance patterns 140 exposed on the bottom surface of the preliminary contact holes 172 may be etched to form contact holes 174 exposing upper surfaces of the gate patterns 112*b* of the step portion. Each of the contact holes 174 may include a first portion 174*a* corresponding to a preliminary contact hole 172 and a second portion 174*b* corresponding to a portion below the preliminary contact hole 172.

In various embodiments, the first variable resistance pattern 140 may have a high etching selectivity with respect to polysilicon. Therefore, in the etching process of the first variable resistance pattern 142*a*, the gate pattern 112*b* including polysilicon exposed on the bottom surface of the contact hole 174 may hardly be etched.

In various embodiments, the etching process of the first variable resistance pattern 140 may include an isotropic etching process, e.g., a wet etching process.

When the wet etching process is performed, the second portion 174*b* of the contact hole may have an inner width greater than inner width of the first portion 174*a* of the contact hole. In various embodiments, a portion of the first variable resistance pattern 140 may be removed, and thus the first variable resistance pattern 140 may remain on a sidewall of the second portion 174*b* of the contact hole.

In various embodiments, the etching process may be performed so that the first variable resistance pattern 140 may remain on the edge portion in the first direction of the cell stacked structure 170. In this case, in a cross-sectional view taken in the first direction, the first variable resistance pattern 140 may remain on the sidewall of the second portion 174*b* of the contact hole.

Figure 27:
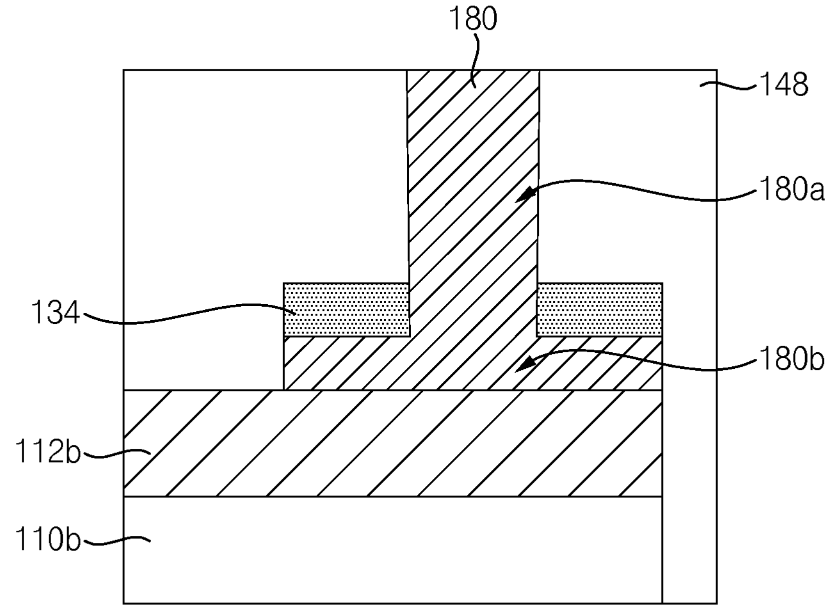

In some embodiments, the etching process may be performed to completely remove the first variable resistance pattern 140 formed on the edge portion in the first direction of the cell stacked structure 170. In this case, as shown in FIG. 27, in a cross-sectional view taken in the first direction, the first variable resistance pattern 140 may not remain on the sidewall of the second portion 174*b* of the contact hole.

Figure 28:
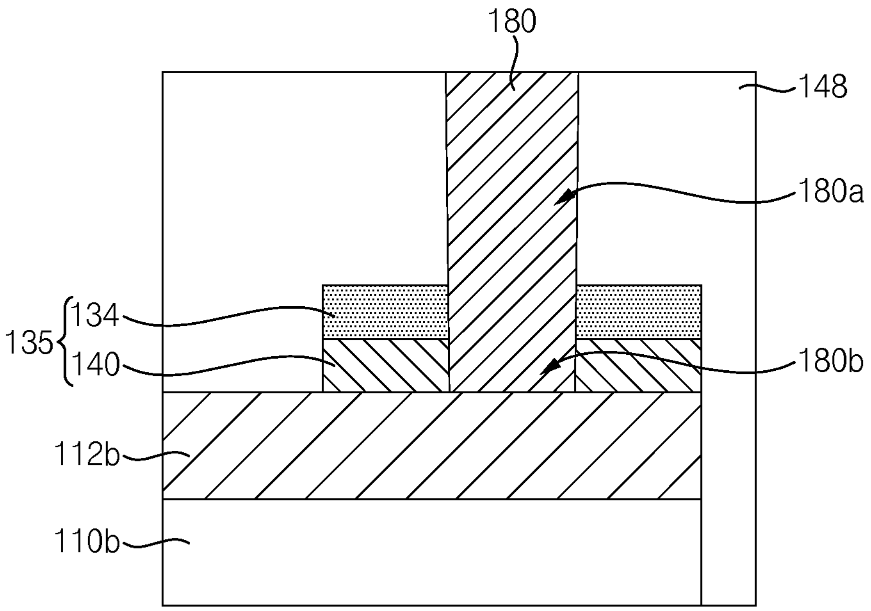

In various embodiments, the first variable resistance pattern 140 may be removed by a dry etching process. In this case, as shown in FIG. 28, the second portion 174*b* may have an inner width substantially same as or less than an inner width of the first portion 174*a*.

Figure 24:
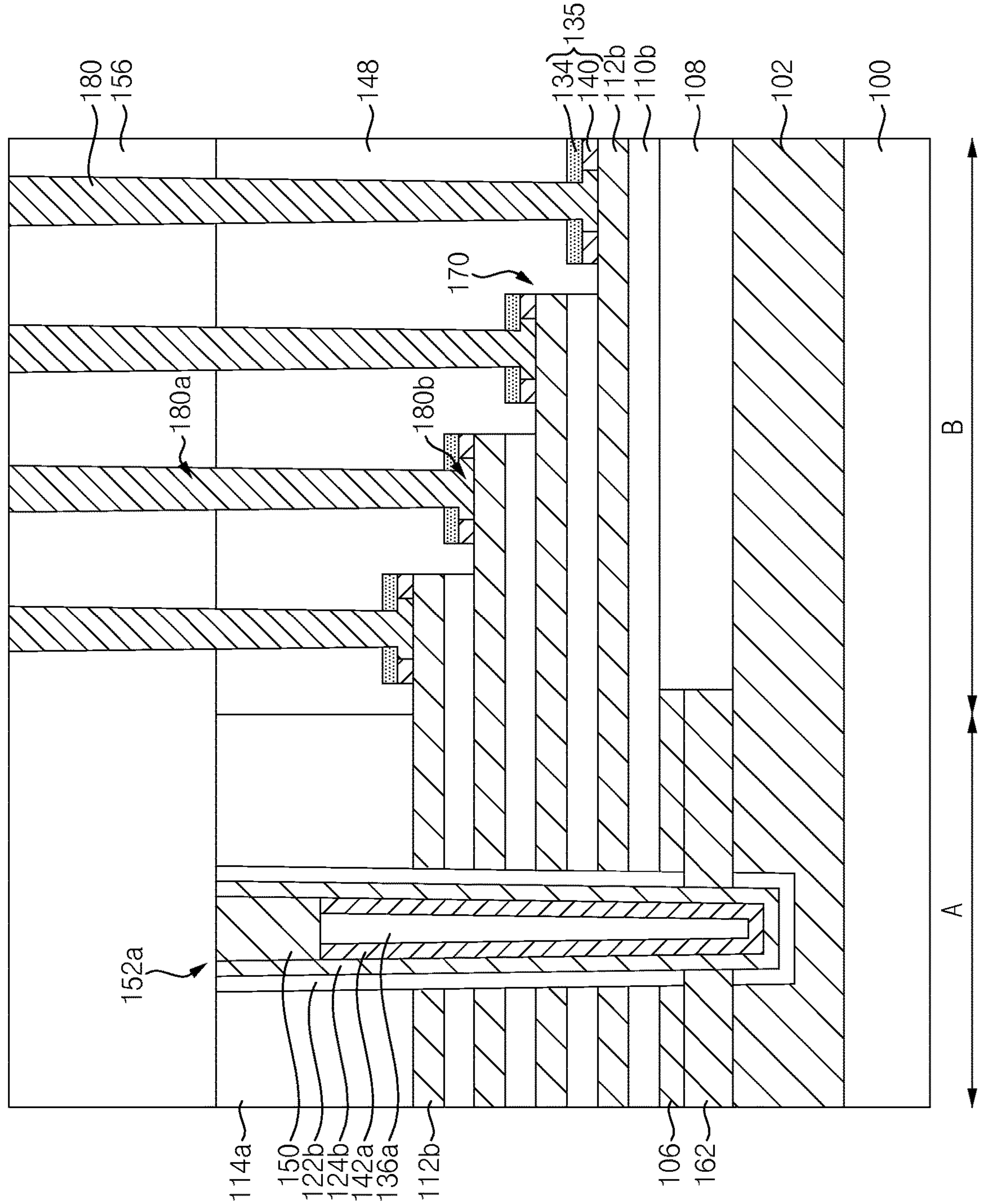
Figure 25:
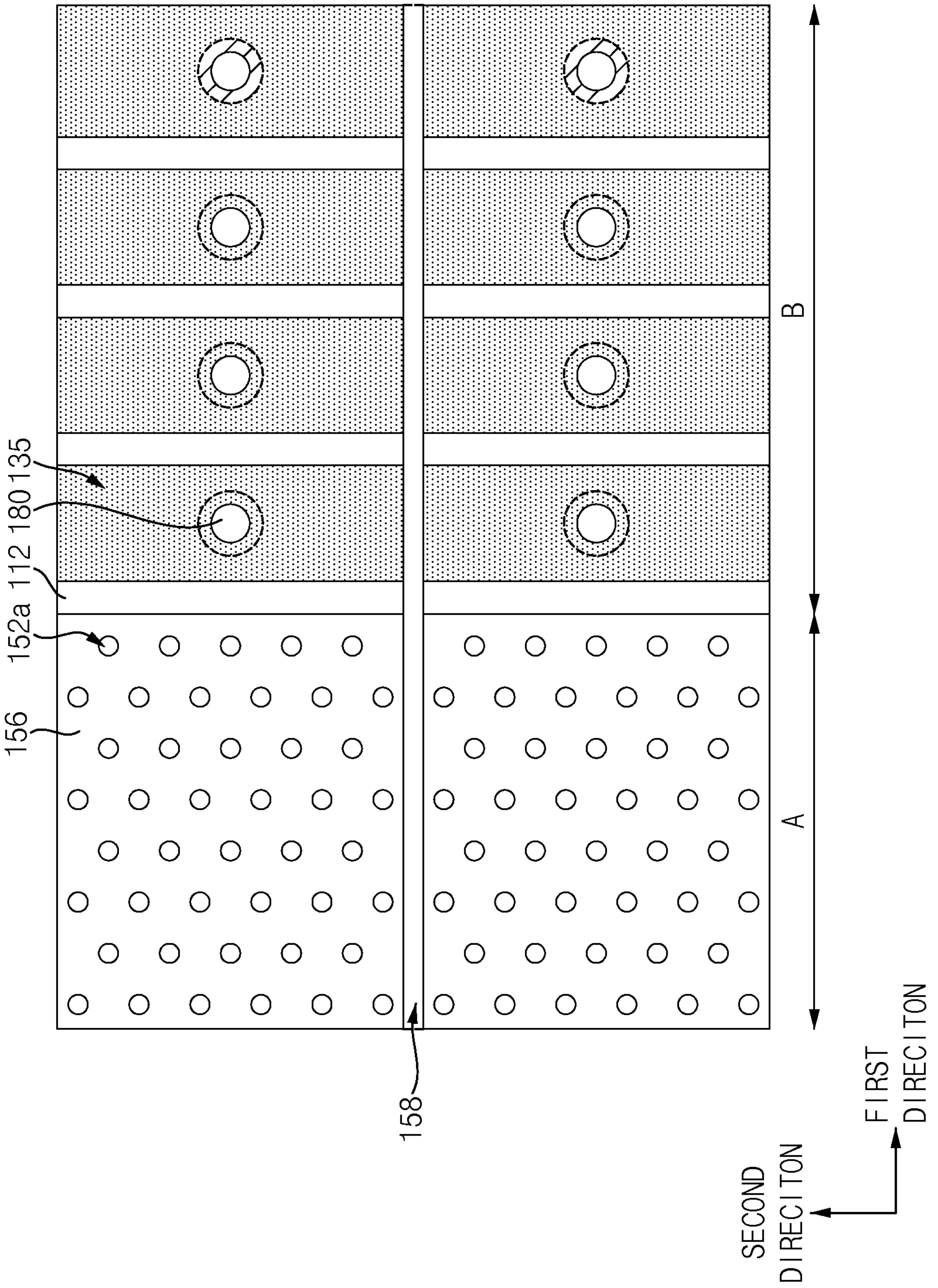

Referring to FIGS. 24 and 25, a conductive layer may be formed on the third insulating interlayer 156 to fill the contact hole 174.

In various embodiments, the conductive layer may include a metal layer, e.g., a tungsten layer. Before forming the metal layer, a barrier metal layer may be conformally formed along the surfaces of the contact hole 174 and the third insulating interlayer 156. The barrier metal layer may include, e.g., titanium, titanium nitride, tantalum, tantalum nitride, etc.

In various embodiments, the conductive layer may be planarized until an upper surface of the third insulating interlayer 156 may be exposed to form contact plugs 180 in the contact holes 174. The planarization process may include a polishing process, e.g., a CMP process. The contact plugs 180 contacting upper surfaces of the gate patterns 112*b* may be formed in the contact holes 174, respectively.

Each of the contact plugs 180 may include a first portion 180*a* extending from the upper surface of the third insulating interlayer 156 to the bottom surface of the mask pattern 134, and a second portion extending from a portion below the first portion to the upper surface of the gate pattern 112*ba*. The second portion 180*b* may have a width greater than a width of the first portion 180*a*.

As described above, when the cell variable resistance layer included in the channel structure is formed in the first region, the first variable resistance pattern serving as the etch stop layer may also be formed on the upper surfaces of the gate patterns in the second region. When the contact plug contacting the upper surface of the gate pattern in the second region is formed, the first variable resistance pattern may be used as an etching stop layer. Therefore, the punching failure or not opening failure of the contact plug may be decreased.

A vertical memory device may be manufactured by the above processes.

The vertical memory device manufactured by the above processes may have the following structural characteristics. Since many characteristics of the vertical memory device have been described above, the additional characteristics may be described. Hereinafter, the vertical memory device shown in FIGS. 24 and 25 may be described.

Figure 26:
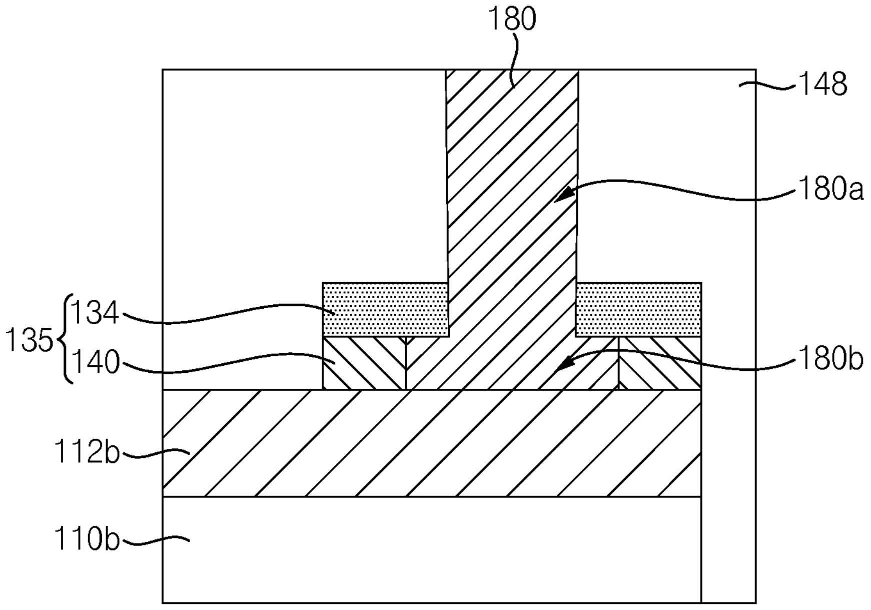

FIG. 26 is an enlarged view of a contact plug of a vertical memory device according to various embodiments. FIG. 27 is an enlarged view of a contact plug of a vertical memory device according to some embodiments. FIG. 28 is an enlarged view of a contact plug of a vertical memory device according to various embodiments.

Referring to FIGS. 24, 25 and 26, a lower semiconductor layer 102 may be formed on a substrate 100. The substrate 100 may include a first region A where a memory cell array is formed and a second region B extending from the memory cell array.

In various embodiments, a channel connection pattern 162 and a support layer pattern 106 may be formed on the lower semiconductor layer 102 of the first region A. A lower insulation layer pattern 108 may be formed on the lower semiconductor layer 102 of the second region B.

In various embodiments, a cell stacked structure 170 in which an insulation layer pattern 110*b* and a gate pattern 112*b* are alternately and repeatedly stacked may be formed on the support layer pattern 106 and the lower insulation layer pattern 108. The cell stacked structure 170 may extend in the first direction, and an edge portion in the first direction of the cell stacked structure 170 may have a step shape. A step portion of the cell stacked structure 170 may expose upper surfaces of the gate patterns 112*b*.

In various embodiments, the cell stacked structure 170 may further include a first insulating interlayer pattern 114*a* formed on an uppermost gate pattern 112*b* in the cell stacked structure 170. An etch stop structure 135 in which a first variable resistance pattern 140 and a mask pattern 134 are stacked may be formed on the upper surface of each of the gate patterns 112*b* of the step portion.

In various embodiments, a channel structure 152*a* may pass through the cell stacked structure 170, the support layer pattern 106, and the channel connection pattern 162 of the first region, and the channel structure 152*a* may extend to an inner portion of the lower semiconductor layer 102.

In various embodiments, the gate pattern 112*b* may include, e.g., polysilicon. The insulation layer pattern 110*b* may include, e.g., silicon oxide. The cell stacked structure 170 may extend from the first region A to the second region B, and the cell stacked structure 170 on the second region B may have the step shape.

In various embodiments, the channel structure 152*a* may be formed in a channel hole 120 passing through the cell stacked structure 170, the support layer pattern 106, and the channel connection pattern 162 of the first region A, and extending to the lower semiconductor layer 102. The channel structure 152*a* may include a gate insulation layer pattern 122*b*, a channel 124*b*, a cell variable resistance pattern 142*a*, a first filling insulation pattern 136*a*, and an upper pad 150. The gate insulation layer pattern 122*b*, the channel 124*b*, and the cell variable resistance pattern 142*a* may be sequentially stacked from a sidewall of the channel hole 120. The first filling insulation pattern 136*a* may be formed on the cell variable resistance pattern 142*a* to fill most of the channel hole 120. The upper pad 150 may be formed on the cell variable resistance pattern 142*a* and the first filling insulation pattern 136*a*, and may contact the channel 124*b*.

In various embodiments, the gate insulation layer pattern 122*b* may be separated into an upper portion and a lower portion by the channel connection pattern 162. That is, the gate insulation layer pattern 122*b* may include the upper portion disposed above an upper surface of the channel connection pattern 162 and the lower portion disposed below a lower surface of the channel connection pattern 162.

In various embodiments, the channel connection pattern 162 may contact a lower sidewall of the channel 124*b*. The channel connection pattern 162 may connect a plurality of neighboring channels 124*b* to each other. Also, the lower surface of the channel connection pattern 162 may contact an upper surface of the lower semiconductor layer 102. Accordingly, the channel 124*b* may be electrically connected to the lower semiconductor layer 102.

In various embodiments, the gate insulation layer pattern 122*b* may include, e.g., silicon oxide. The channel 124*b* may include polysilicon.

In various embodiments, the cell variable resistance pattern 142*a* may include a material whose electrical resistance changes due to oxygen vacancy or oxygen movement. The cell variable resistance pattern 142*a* may include a material having a high etching selectivity with respect to silicon oxide. Also, the cell variable resistance pattern 142*a* may include a material having a high etching selectivity with polysilicon. In example embodiments, the channel 124*b* and the cell variable resistance pattern 142*a* may have a cup shape.

In various embodiments, the cell variable resistance pattern 142*a* may include a transition metal oxide, e.g., $HfO_2$, $RuO_2$, $MnO_2$, $CeO_2$, $V_2O_5$, NiO, $Co_2O_3$, $Ta_2O_5$, etc. The transition metal oxide may be used alone or in a combination of two or more transition metal oxides.

In various embodiments, the first filling insulation pattern 136*a* may include, e.g., silicon nitride. The first filling insulation pattern 136*a* may not include oxide. If the first filling insulation pattern 136*a* includes oxide, the oxygen vacancy in the cell variable resistance pattern 142*a* contacting the first filling insulation pattern 136*a* may be decreased or removed during a deposition process of the first filling insulation layer. If the first filling insulation pattern 136*a* includes oxide, characteristics of the cell variable resistance pattern may be degraded. Therefore, the first filling insulation pattern 136*a* may not include oxide.

In various embodiments, the upper pad 150 may include, e.g., polysilicon.

One gate pattern 112*b* and one channel structure 152*a* contacting the one gate pattern 112*b* may serve as one memory cell. The gate insulation layer pattern 122*b*, the channel 124*b*, the cell variable resistance pattern 142*a*, and the first filling insulation pattern 136*a* may be sequentially stacked on the sidewall of the gate pattern 112*b*.

Depending on a voltage applied to the gate pattern 112*b*, the oxygen vacancy included in the cell variable resistance pattern 142*a* may move to form a filament or a depletion region. Accordingly, a portion of the cell variable resistance pattern 142*a* facing the gate pattern 112*b* may have a high resistance state or a low resistance state, so that data may be written to the memory cell. When the portion of the cell variable resistance pattern 142*a* facing the gate pattern 112*b* has the low resistance state, currents flowing through the channel 124*b* in the vertical direction may flow toward the cell variable resistance pattern 142*a* having low resistance state of the memory cell. In this case, flowing of currents may be changed from the channel 124*b* to the cell variable resistance pattern 142*a*. When the portion of the cell variable resistance pattern 142*a* facing the gate pattern 112*b* has a high resistance state, currents may flow through the channel 124*b* in the vertical direction. In this case, currents may not flow through the cell variable resistance pattern 142*a*. As such, data written in the memory cell may be read by sensing of change of the current flowing through the channel 124*b* and the cell variable resistance pattern 142*a*.

In various embodiments, the etch stop structure 135 may not cover an entire surface of the upper surface of the gate pattern 112*b* of the stepped portion of the cell stacked structure 170, but may cover a portion of upper surface of the gate pattern 112*b* of the stepped portion of the cell stacked structure 170.

In various embodiments, the etch stop structure 135 on one step may be horizontally spaced apart from sidewalls of the gate pattern 112*b* and the insulation layer pattern 110*b* positioned on the etch stop structure 135. In various embodiments, the etch stop structure 135 may cover an edge portion in the first direction of the upper surface of the gate pattern 112*b* of each of steps.

In various embodiments, the first variable resistance pattern 140 may include a material that is the same as the cell variable resistance pattern 142*a* included in the channel structure 152*a*. Also, a thickness (i.e., vertical thickness) of the first variable resistance pattern 140 may be substantially the same as a thickness (i.e., horizontal thickness) of the cell variable resistance pattern 142*a* formed on the sidewall of the channel hole. Where the first variable resistance pattern 140 and the cell variable resistance pattern 142*a* are formed by the same deposition process, the first variable resistance pattern 140 and the cell variable resistance pattern 142*a* may have the same material and the same thickness. Therefore, a thickness in a horizontal direction of the cell variable resistance pattern 142*a* formed on the sidewall of the channel hole 120 would be the same as a thickness in a vertical direction of the first variable resistance pattern 140 on the upper surface of the gate patterns 112*b*.

In various embodiments, the first variable resistance pattern 140 may include a transition metal oxide, e.g., $HfO_2$, $RuO_2$, $MnO_2$, $CeO_2$, $V_2O_5$, NiO, $Co_2O_3$, $Ta_2O_5$, etc. The transition metal oxide may be used alone or in a combination of two or more transition metal oxides.

In various embodiments, the mask pattern 134 may include a material that is the same as a material of the first filling insulation pattern 136*a* in the channel structure 152*a*. When the mask pattern 134 and the first filling insulation pattern 136*a* are formed by the same deposition process, the mask pattern 134 and the first filling insulation pattern 136*a* may include the same material. The mask pattern 134 may include, e.g., silicon nitride.

In various embodiments, a second insulating interlayer pattern 148 may cover the step portion of the cell stacked structure 170. The second insulating interlayer pattern 148 may include, e.g., silicon oxide. Upper surfaces of the first and second insulating interlayer patterns 114*a* and 148 may be coplanar with each other, and may be substantially flat.

In various embodiments, a third insulating interlayer 156 may be formed on the first insulating interlayer patterns 114*a* and the second insulating interlayer patterns 148. The third insulating interlayer 156 may include, e.g., silicon oxide.

In various embodiments, a contact plug 180 may pass through the third insulating interlayer 156, the second insulating interlayer pattern 148, and the etch stop structure 135 of the second region B, where the contact plug 180 may contact the upper surface of the gate pattern 112*b* of each of the steps.

In various embodiments, the contact plug 180 may include a first portion 180*a* extending from an upper surface of the third insulating interlayer 156 to a lower surface of the mask pattern 134 of the etch stop structure 135, and a second portion 180*b* extending from a bottom of the first portion to the upper surface of the gate pattern 112*b*.

In various embodiments, the second portion 180*b* may have a width greater than the first portion 180*a*. Accordingly, the second portion 180*b* of the contact plug may protrude laterally from a lower sidewall of the first portion 180*a*. A bottom of the second portion 180*b* of the contact plug may be greater than the bottom of the first portion 180*a* of the contact plug. Accordingly, a contact area between the contact plug 180 and the upper surface of the gate pattern 112*b* may be increased.

A shape of the contact plug may vary according to a shape of a contact hole for forming the contact plug.

In various embodiments, as shown in FIG. 26, the first variable resistance pattern 140 may remain on the upper surface of the edge portion in the first direction of the gate pattern 112*b*. In this case, in a cross-sectional view taken in the first direction, the first variable resistance pattern 140 may remain on the sidewall of the second portion 180*b* of the contact plug 180. Thus, the first variable resistance pattern 140 may completely surround the sidewall of the second portion 180*b* of the contact plug.

In some embodiments, as shown in FIG. 27, the first variable resistance pattern 140 may not remain on the upper surface of the edge portion in the first direction of the gate pattern 112*b*. In this case, in a cross-sectional view taken in the first direction, the first variable resistance pattern 140 may not remain on the sidewall of the second portion 180*b* of the contact plug 180. Accordingly, the first variable resistance pattern 140 may be around only a portion of the sidewall of the second portion 180*b* of the contact plug.

In various embodiments, when the first variable resistance pattern 140 is etched by an anisotropic etching process to form the contact hole, as shown in FIG. 28, the lower portion of the contact plug 180 may not expand in the horizontal direction. The contact plug 180 may extend to the upper surface of the gate pattern 112*b* without expansion of lower portion thereof.

As the etch stop structure 135 is included, the contact plug 180 may contact the upper surface of the gate pattern 112*b* of a target step. In the contact plugs 180, a punching defect that extends to a step below the target step or a not open defect in which the upper surface of the gate pattern of the target step is not exposed may be decreased.

FIGS. 29 to 35 are cross-sectional views illustrating a method of manufacturing a vertical memory device according to various embodiments.

Figure 29:
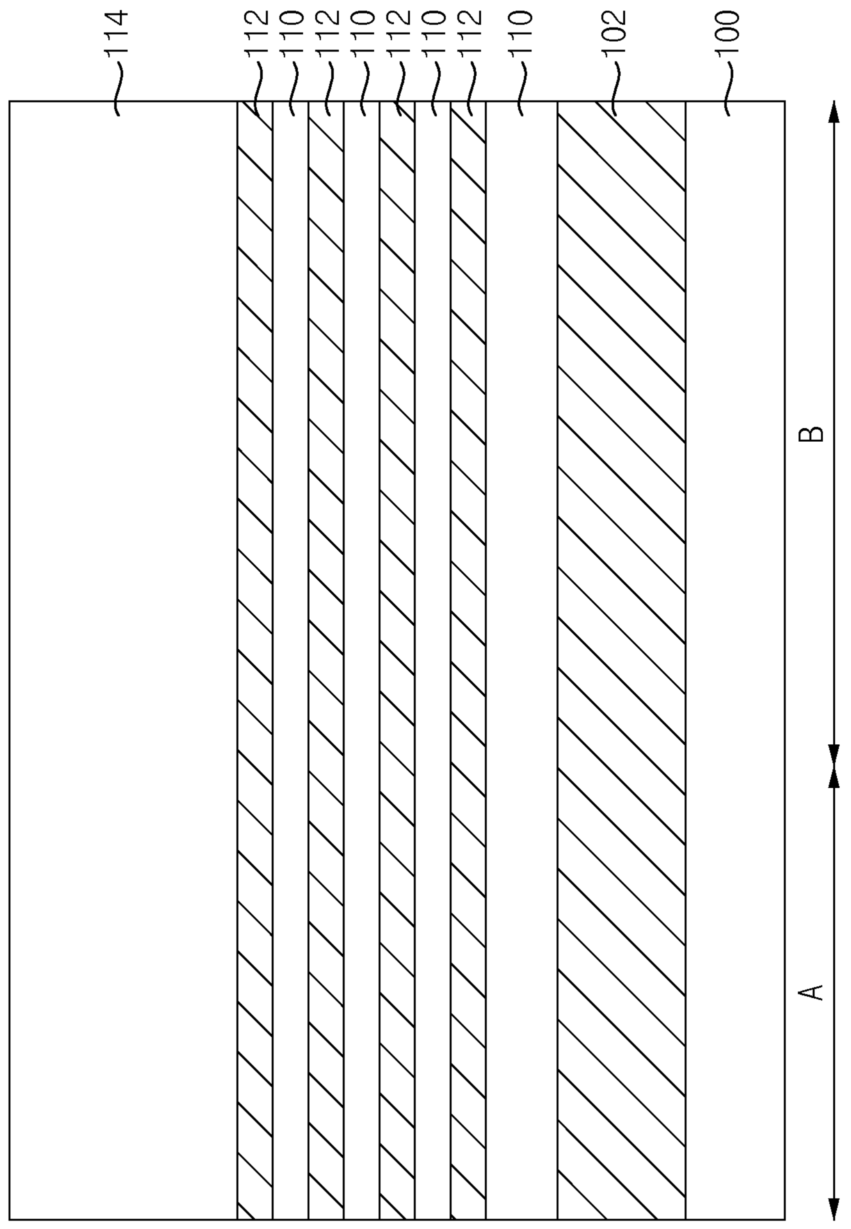

Referring to FIG. 29, the lower semiconductor layer 102 may be formed on the substrate 100.

In various embodiments, the substrate 100 may include the first region, A, where the memory cell array is formed and the second region, B, extending from the memory cell array.

In various embodiments, the insulation layer 110 and the gate electrode layer 112 are alternately and repeatedly stacked on the lower semiconductor layer 102. In various embodiments, a thickness of a lowermost insulation layer 110 may be greater than a thickness of other insulation layers.

In various embodiments, the first insulating interlayer 114 may be formed on an uppermost gate electrode layer 112. The first insulating interlayer 114 may include, e.g., silicon oxide. A thickness of the first insulating interlayer 114 may be greater than each of the insulation layers 110.

Figure 30:
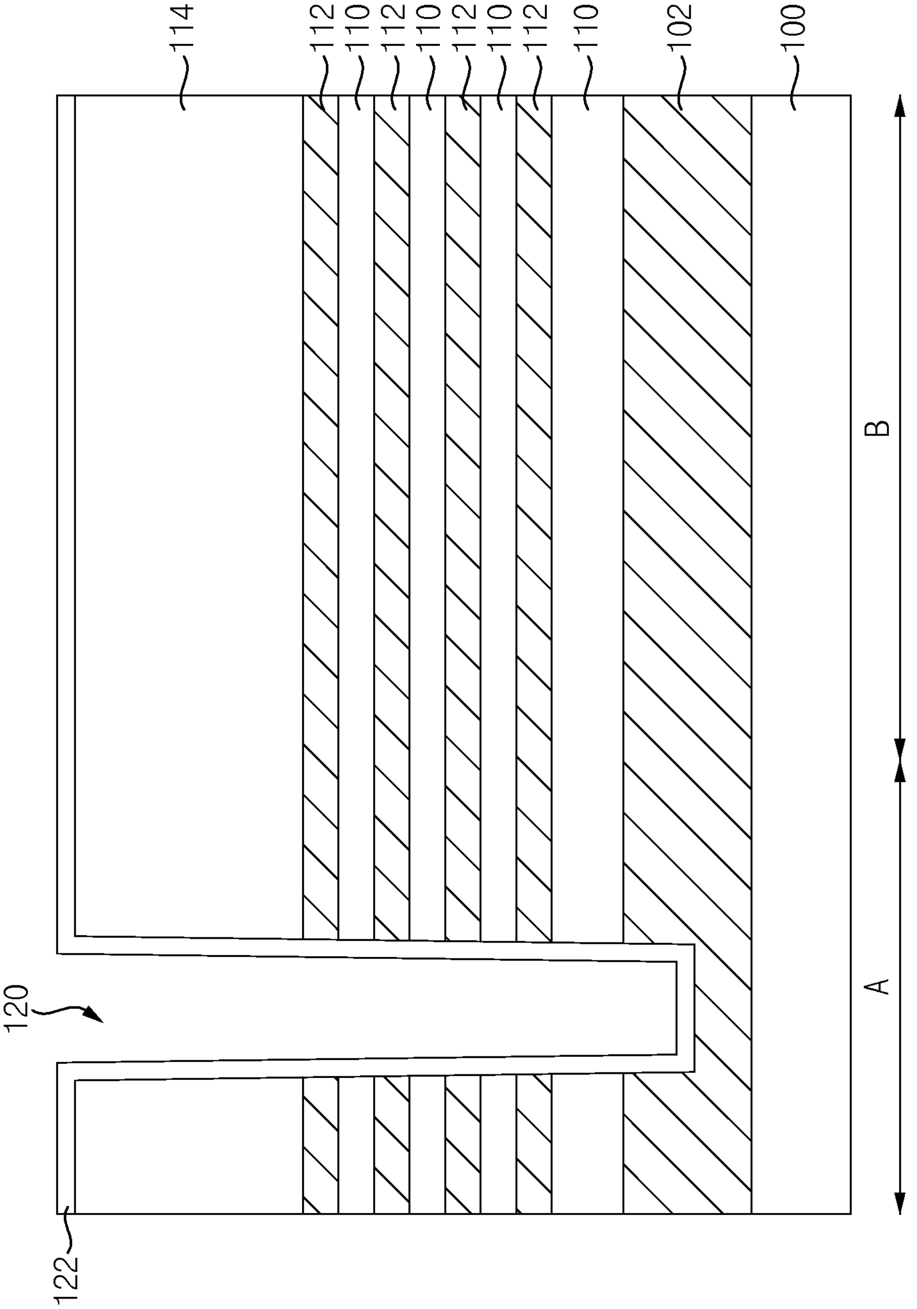

Referring to FIG. 30, the channel holes 120 may be formed through the first insulating interlayer 114, the insulation layers 110, and the gate electrode layers 112 of the first region, A. The channel holes 120 may extend to an inner portion of the lower semiconductor layer 102 between an upper surface and a lower surface of the lower semiconductor layer 102. The channel hole 120 may not be formed in the second region B.

In various embodiments, the gate insulation layer 122 may be formed along sidewalls and bottom surfaces of the channel holes 120 and an upper surface of the first insulating interlayer 114. The gate insulation layer 122 may include an oxide, e.g., silicon oxide. The gate insulation layer 122 may be formed by an ALD process.

Figure 31:
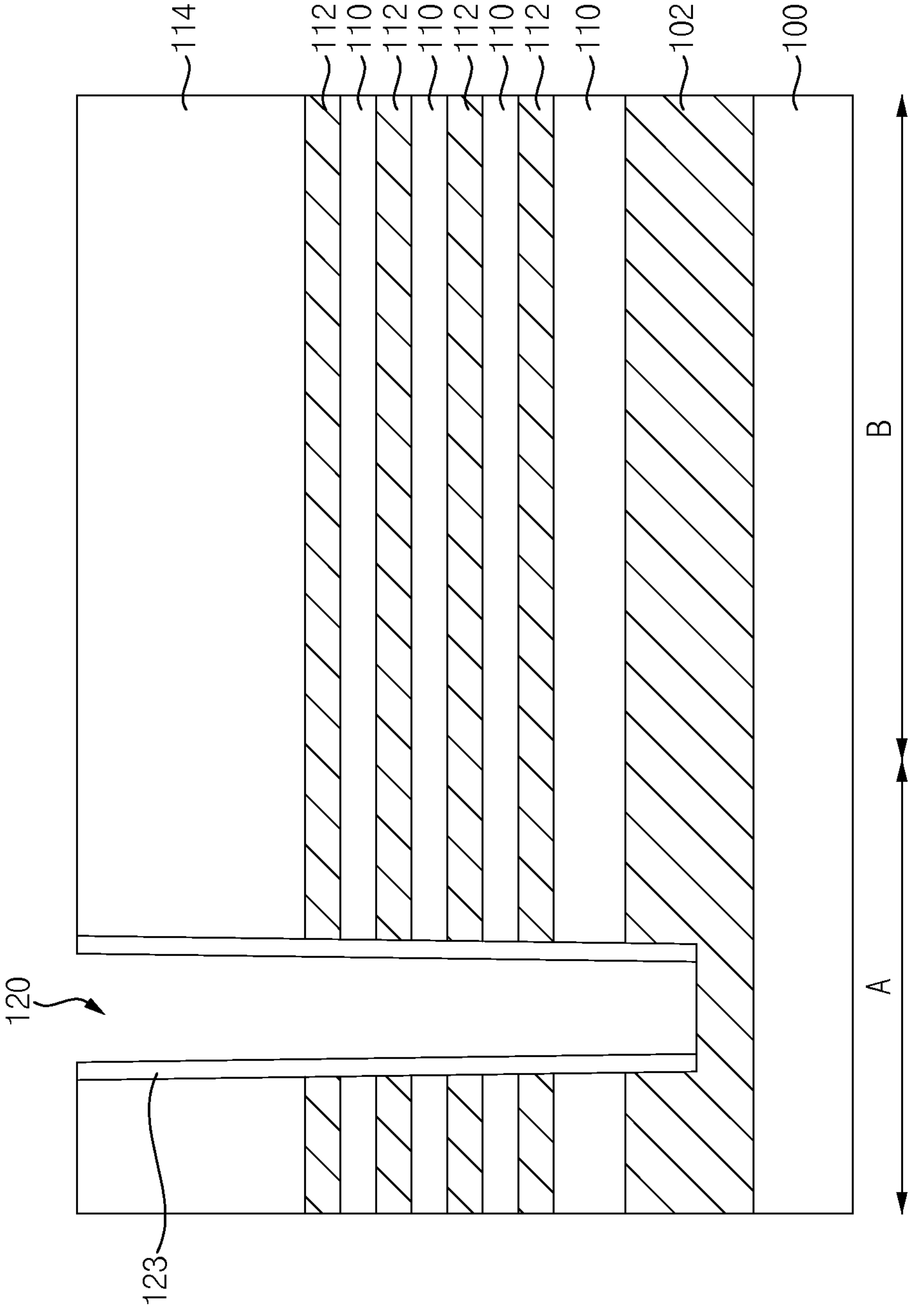

Referring to FIG. 31, the gate insulation layer 122 formed on the bottom surface of the channel hole 120 may be etched by anisotropic etching process to form a gate insulation layer pattern 123, where the gate insulation layer 122 remains along the sidewalls of the channel holes 120. When the etching process is performed, the gate insulation layer 122 formed on the upper surface of the first insulating interlayer 114 may be etched together with the gate insulation layer 122 on the bottom surfaces of the channel holes 120.

In various embodiments, the gate insulation layer pattern 123 may be formed on the sidewall of the channel hole 120. The lower semiconductor layer 102 may be exposed by the bottom surface of the channel hole 120.

Figure 32:
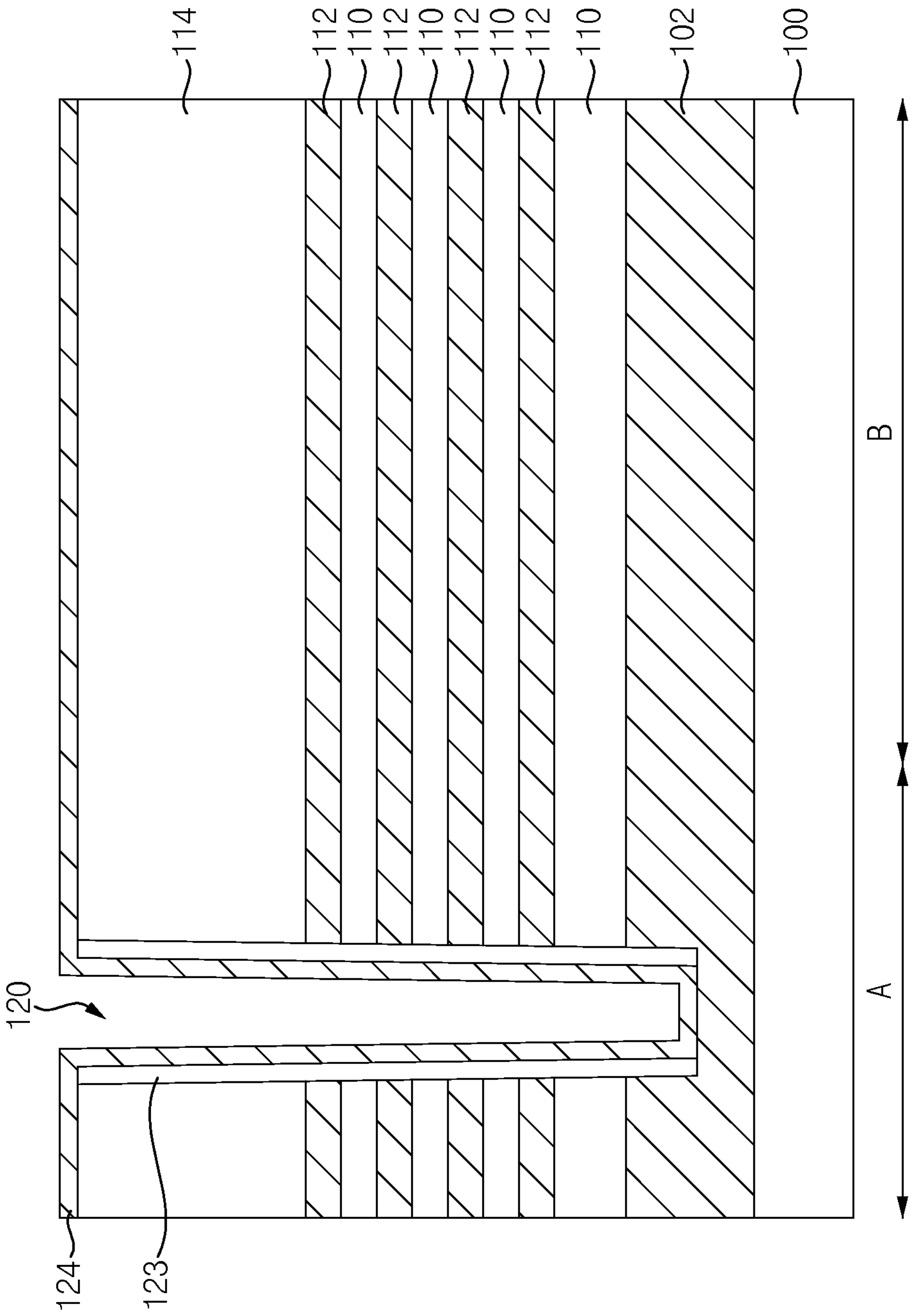

Referring to FIG. 32, the channel layer 124 may be formed along upper surfaces of the first insulating interlayer 114, the gate insulation layer pattern 123 and the lower semiconductor layer 102 exposed by the bottom surface of the channel hole 120. In a non-limiting exemplary embodiment, the channel layer 124 may include, e.g., polysilicon.

In various embodiments, the channel layer 124 may be in physical contact with the lower semiconductor layer 102. Therefore, a channel connection pattern may not be formed by subsequent processes.

Figure 33:
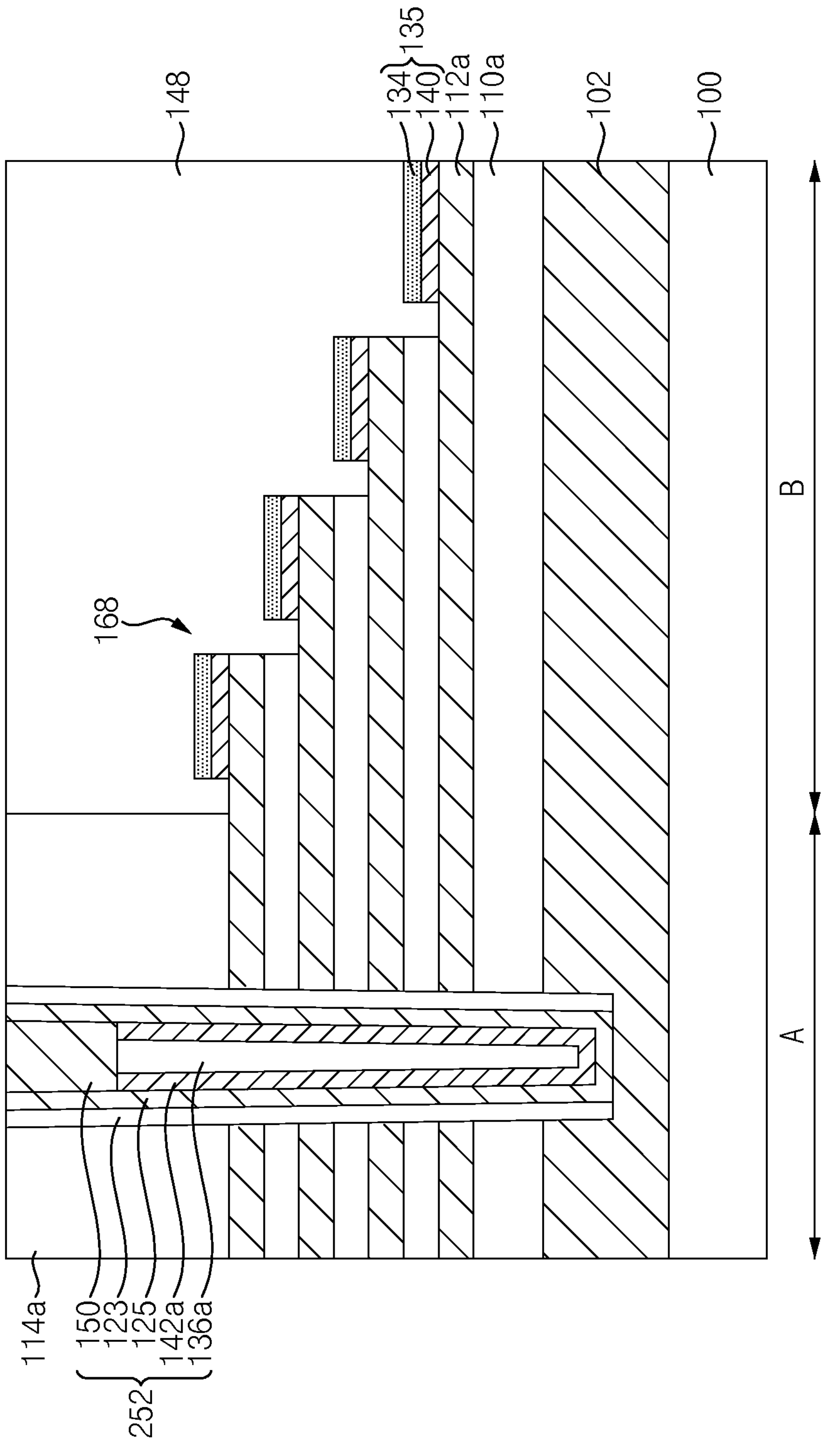

Referring to FIG. 33, the same processes described with reference to FIGS. 7 to 17 may be performed on a structure as shown in FIG. 32.

Accordingly, a preliminary cell stacked structure 168 may be formed on the lower semiconductor layer 102. The preliminary cell stacked structure 168 may include a structure in which the preliminary insulation layer pattern 110*a* and the preliminary gate pattern 112*a* are alternately stacked, the first insulating interlayer pattern 114*a*, and the etch stop structure 135.

In various embodiments, the channel structure 252 may be formed through the preliminary cell stacked structure 168 of the first region A. The channel structure 252 may include the gate insulation layer pattern 123, the channel 125, the cell variable resistance pattern 142*a*, the first filling insulation pattern 136*a*, and the upper pad 150. A bottom surface of the channel 125 may directly contact the lower semiconductor layer 102.

Figure 34:
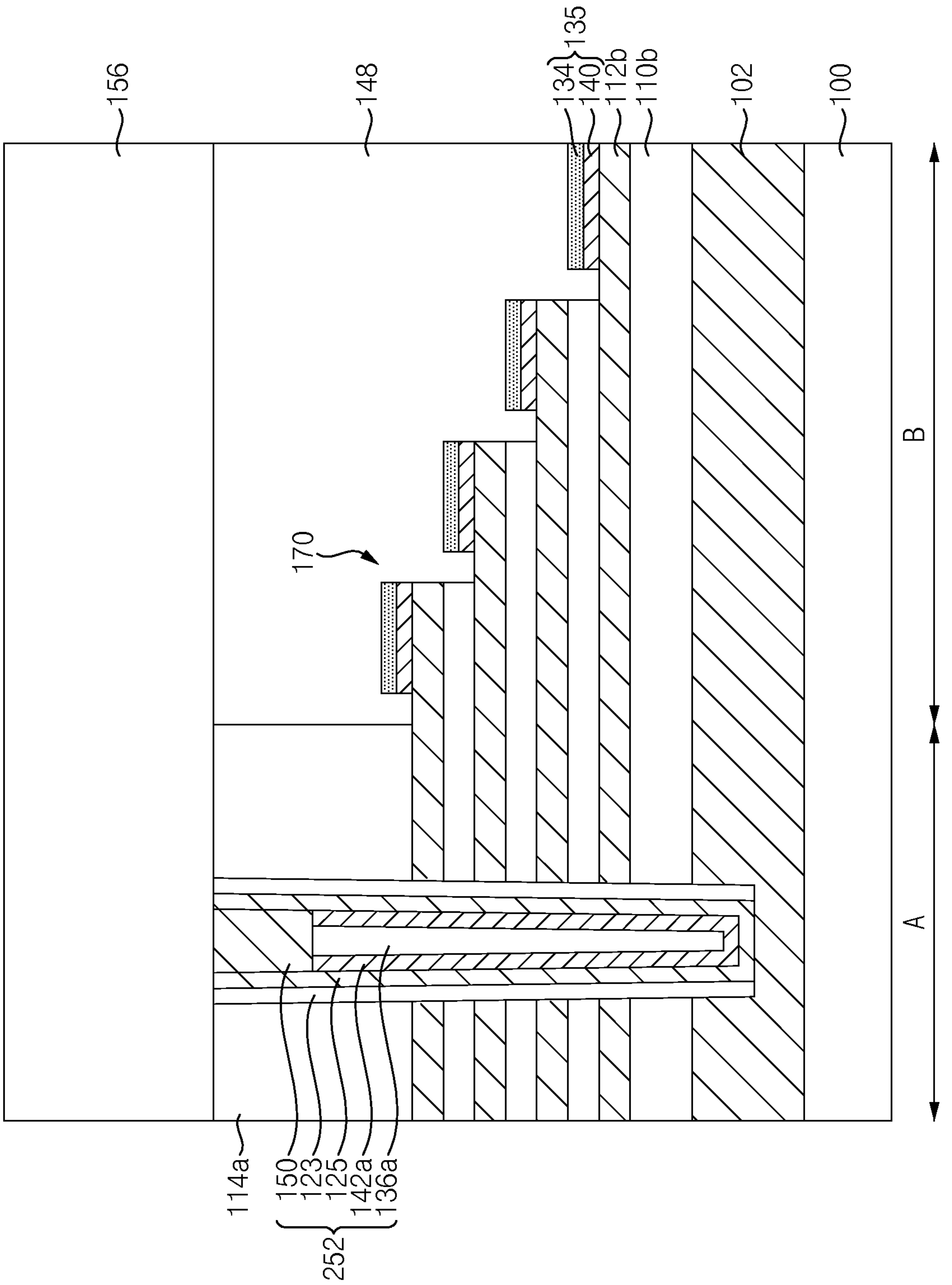

Referring to FIG. 34, the third insulating interlayer 156 may be formed on the first insulating interlayer pattern 114*a*, the channel structure 252, and the second insulating interlayer pattern 148.

In various embodiments, the third insulating interlayer 156, the second insulating interlayer pattern 148, and the preliminary cell stacked structure 168 may be etched to form a trench extending in the first direction. The lower semiconductor layer 102 may be exposed at the bottom e of the trench. Accordingly, the preliminary cell stacked structure may be separated by the trench to form the cell stacked structures 170.

Each of the cell stacked structures 170 may include: a structure in which the insulation layer pattern 110*b* and the gate pattern 112*b* are alternately stacked, and the first insulating interlayer pattern 114*a*. The etch stop structure 135 may be formed on the step portion of the cell stacked structure 170.

Figure 35:
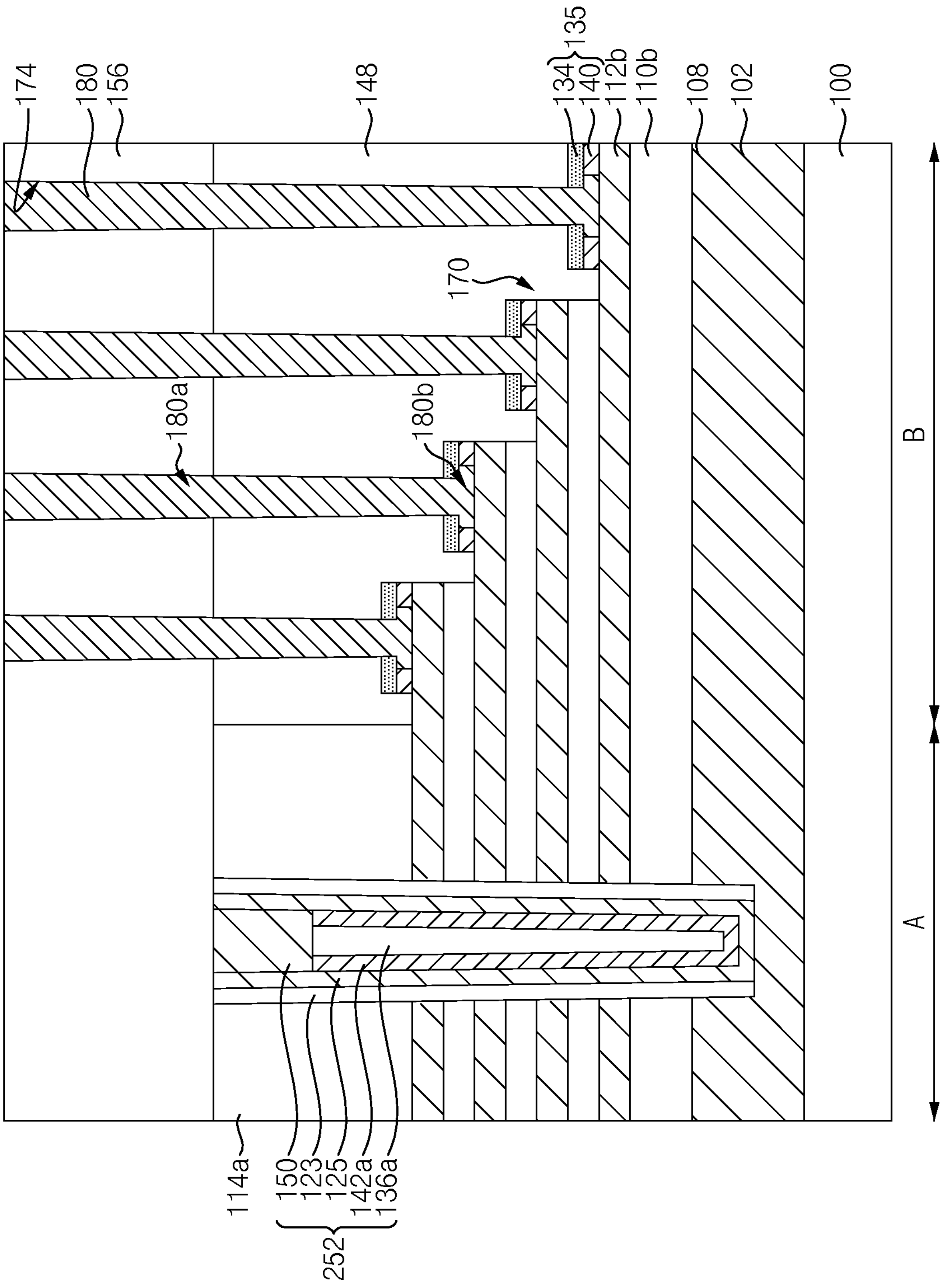

Referring to FIG. 35, an etching mask pattern may be formed on the third insulating interlayer 156. The third insulating interlayer 156, the second insulating interlayer pattern 148, and the mask pattern 134 in the second region may be etched using the etching mask pattern to form the preliminary contact hole exposing the first variable resistance pattern 140 on the upper surface of each of the steps.

Thereafter, the first variable resistance patterns 140*a* exposed by the bottom surfaces of the preliminary contact holes may be etched to form contact holes 174 exposing the upper surfaces of the gate patterns 112*b* of the step portion.

In various embodiments, a contact plug 180 may be formed to fill each of the contact holes 174. The contact plug 180 may include a first portion 180*a* extending from an upper surface of the third insulating interlayer 156 to the bottom surface of the mask pattern 134, and a second portion 180*b* extending from a bottom of the first portion 180*a* to the upper surface of the gate pattern 112*b*. The second portion 180*b* may have a width greater than a width of the first portion 180*a*.

In various embodiments, the processes may be substantially the same as that described with reference to FIGS. 22 to 25. By the above process, a vertical memory device as shown in FIG. 35 may be manufactured.

The vertical memory device manufactured by the above processes may have the same or similar structure as the vertical memory device described with reference to FIGS. 24 and 25, except for a channel structure.

In the vertical memory device shown in FIG. 35, the channel structure 252 may be formed in the channel hole passing through the cell stacked structure 170 and extending to the upper portion of the lower semiconductor layer 102. The channel structure 252 may include the gate insulation layer pattern 123, the channel 125, the cell variable resistance pattern 142*a*, the first filling insulation pattern 136*a*, and the upper pad 150.

In various embodiments, the gate insulation layer pattern 123 may be formed on a sidewall of the channel hole. The gate insulation layer pattern 123 may surround the sidewall of the channel hole. The channel 125 may contact the gate insulation layer pattern 123 and an upper surface of the lower semiconductor layer 102 exposed by a bottom of the channel hole. The cell variable resistance pattern 142*a* may be formed on a surface of the channel 125. The first filling insulation pattern 136*a* may be formed on the cell variable resistance pattern 142*a*, and may fill most of the channel hole, where the top surface of the first filling insulation pattern 136*a* may be between the top surface and the bottom surface of the first insulating interlayer pattern 114*a*. The upper pad 150 may be formed on the first filling insulation pattern 136*a* and the cell variable resistance pattern 142*a*, and may contact the channel 125.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A vertical memory device, comprising:

a lower semiconductor layer on a substrate including a first region and a second region;

a cell stacked structure on the lower semiconductor layer, the cell stacked structure including an insulation layer pattern and a gate pattern that are alternately and repeatedly stacked, wherein the cell stacked structure extends in a first direction parallel to an upper surface of the substrate, and wherein an edge portion in the first direction of the cell stacked structure is disposed in the second region and has a step portion having a step shape;

an etch stop structure on an upper surface of each of gate patterns of the step portion of the cell stacked structure, wherein the etch stop structure includes a first variable resistance pattern and a mask pattern that are stacked;

a channel structure passing through the cell stacked structure on the first region, and extending to an inner portion of the lower semiconductor layer;

an insulating interlayer covering the cell stacked structure and the mask pattern; and a contact plug passing through the insulating interlayer and the etch stop structure in the second region, wherein the contact plug contacts the upper surface of each of the gate patterns in the second region, wherein on one step the insulating interlayer is interposed between the etch stop structure and sidewalls of the gate pattern and the insulation layer pattern of another step.

2. The vertical memory device of claim 1, wherein the channel structure is in a channel hole passing through the cell stacked structure, and the channel structure includes a gate insulation layer pattern, a channel, a cell variable resistance pattern, a filling insulation pattern, and an upper pad.

3. The vertical memory device of claim 2, wherein the cell variable resistance pattern and the first variable resistance pattern include the same material.

4. The vertical memory device of claim 2, wherein the gate insulation layer pattern, the channel, and the cell variable resistance pattern are sequentially stacked on sidewalls of the channel hole, and the channel is electrically connected to the lower semiconductor layer.

5. The vertical memory device of claim 2, wherein the cell variable resistance pattern has a cup shape, and wherein a thickness in a horizontal direction of the cell variable resistance pattern on a sidewall of the channel hole is the same as a thickness in a vertical direction of the first variable resistance pattern on the upper surface of the gate patterns.

6. The vertical memory device of claim 1, wherein the first variable resistance pattern includes a transition metal oxide.

7. The vertical memory device of claim 6, wherein the first variable resistance pattern includes $HfO_2$, $RuO_2$, $MnO_2$, $CeO_2$, $V_{205}$, NiO, $Co_2O_3$, or $Ta_2O_5$.

8. The vertical memory device of claim 1, wherein the contact plug has a first portion extending from an upper surface of the insulating interlayer to a bottom surface of the mask pattern of the etch stop structure and a second portion extending from a bottom of the first portion to an upper surface of the gate pattern, and wherein the second portion has a width greater than a width of the first portion.

9. The vertical memory device of claim 1, wherein the first variable resistance pattern included in the etch stop structure directly contacts a portion of the upper surface of each of the gate patterns of the step portion of the cell stacked structure.

10. The vertical memory device of claim 1, wherein the etch stop structure is horizontally spaced apart from sidewalls of the insulation layer pattern and the gate pattern positioned on the etch stop structure.

11. The vertical memory device of claim 1, wherein the gate pattern includes polysilicon.

12. The vertical memory device of claim 1, wherein the mask pattern includes silicon nitride.

13. A vertical memory device, comprising:

a lower semiconductor layer on a substrate including a first region and a second region;

a cell stacked structure on the lower semiconductor layer, wherein the cell stacked structure includes an insulation layer pattern and a gate pattern that are alternately and repeatedly stacked, and wherein the cell stacked structure extends in a first direction parallel to an upper surface of the substrate, and wherein an edge portion in the first direction of the cell stacked structure is disposed in the second region and has a step portion having a step shape;

an etch stop structure on an upper surface of each of gate patterns of the step portion of the cell stacked structure, wherein the etch stop structure includes a first variable resistance pattern and a mask pattern that are stacked;

a channel structure in a channel hole passing through the cell stacked structure on the first region and extending to an inner portion of the lower semiconductor layer, wherein the channel structure includes a gate insulation layer pattern, a channel, and a cell variable resistance pattern, that are stacked on a sidewall of the channel hole, and wherein the channel is electrically connected to the lower semiconductor layer;

an insulating interlayer covering the cell stacked structure; and a contact plug passing through the insulating interlayer and the etch stop structure in the second region, wherein the contact plug contacts the upper surface of each of the gate patterns in the second region, wherein the cell variable resistance pattern and the first variable resistance pattern include the same material, and wherein a thickness in a horizontal direction of the cell variable resistance pattern on the sidewall of the channel hole is the same as a thickness in a vertical direction of the first variable resistance pattern on the upper surface of the gate patterns.

14. The vertical memory device of claim 13, wherein the first variable resistance pattern includes a transition metal oxide.

15. The vertical memory device of claim 13, wherein the contact plug has a first portion extending from an upper surface of the insulating interlayer to a bottom surface of the mask pattern of the etch stop structure and a second portion extending from a bottom of the first portion to an upper surface of the gate pattern, and wherein the second portion has a width greater than a width of the first portion.

16. The vertical memory device of claim 13, wherein the gate pattern includes polysilicon.

17. The vertical memory device of claim 13, further comprising a channel connection pattern between the lower semiconductor layer and the cell stacked structure, and wherein the channel connection pattern is electrically connected to the lower semiconductor layer and the channel.

18. A vertical memory device, comprising:

a cell stacked structure on a substrate, wherein the cell stacked structure includes an insulation layer pattern and a gate pattern that are alternately and repeatedly stacked, and wherein the cell stacked structure extends in a first direction parallel to an upper surface of the substrate, and wherein an edge portion in the first direction of the cell stacked structure is disposed in a second region and has a step portion having a step shape;

an etch stop structure on an upper surface of each of gate patterns of the step portion of the cell stacked structure, wherein the etch stop structure includes a transition metal oxide;

an insulating interlayer covering the cell stacked structure and the etch stop structure; and a contact plug passing through the insulating interlayer and the etch stop structure, wherein the contact plug contacts the upper surface of each of the gate patterns, wherein on one step the insulating interlayer is interposed between the etch stop structure and sidewalls of the gate pattern and the insulation layer pattern of another step.

19. The vertical memory device of claim 18, further comprising a channel structure passing through the cell stacked structure, and wherein the channel structure includes a cell variable resistance pattern including the transition metal oxide.

20. The vertical memory device of claim 18, wherein the contact plug has a first portion that contacts the transition metal oxide included in the etch stop structure, and wherein the first portion contacting the transition metal oxide of the contact plug has a width greater than a width of a second portion of the contact plug.

* * * * *